United States Patent
Qu

(10) Patent No.: US 12,101,172 B2
(45) Date of Patent: Sep. 24, 2024

(54) METHOD AND APPARATUS FOR PROVIDING TIME SOURCE FOR AUTONOMOUS DRIVING

(71) Applicant: Huawei Technologies Co., Ltd., Shenzhen (CN)

(72) Inventor: Mingguang Qu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 245 days.

(21) Appl. No.: 17/748,849

(22) Filed: May 19, 2022

(65) Prior Publication Data

US 2022/0278745 A1 Sep. 1, 2022

Related U.S. Application Data

(63) Continuation of application No. PCT/CN2019/119754, filed on Nov. 20, 2019.

(51) Int. Cl.
*H04B 7/185* (2006.01)
*B60W 60/00* (2020.01)
(Continued)

(52) U.S. Cl.
CPC ....... *H04B 7/18519* (2013.01); *B60W 60/001* (2020.02); *G06F 1/06* (2013.01); *B60W 2556/50* (2020.02); *H03B 5/30* (2013.01)

(58) Field of Classification Search
CPC ... H04B 7/18519; H03B 5/30; B60W 60/001; B60W 2556/50; G06F 1/06
See application file for complete search history.

(56) References Cited

U.S. PATENT DOCUMENTS 10,021,661 B2 * 7/2018 Shen ................. H04W 56/0015
10,775,481 B1 * 9/2020 Puglielli ............... G01S 7/4091
(Continued)

FOREIGN PATENT DOCUMENTS

| | | |
|---|---|---|
| CN | 103716107 A | 4/2014 |
| CN | 103913987 A | 7/2014 |

(Continued)

OTHER PUBLICATIONS

Hasan, "GNSS Time Synchronisation in Co-operative Vehicular Networks," School of Electrical Engineering and Computer Science, XP055781510, Total 173 pages (Jan. 1, 2018).
(Continued)

*Primary Examiner* — Edwin A Young
(74) *Attorney, Agent, or Firm* — Leydig, Voit & Mayer, Ltd.

(57) ABSTRACT

A method and an apparatus for providing a time source for autonomous driving are provided, which may be applied to autonomous driving of a vehicle in the field of artificial intelligence. The method includes: providing a first time source for a first subsystem of an autonomous driving system by using a first crystal oscillator, and providing a second time source for a second subsystem of the autonomous driving system based on a received satellite time signal. According to embodiments of the present disclosure, a stable and reliable global time source reference can be provided for the autonomous driving system, to ensure secure operation of the autonomous driving system, and meet a requirement of the system for coordinated universal time.

21 Claims, 13 Drawing Sheets

---

Provide a first time source for a first subsystem of an autonomous driving system by using a first crystal oscillator, and provide a second time source for a second subsystem of the autonomous driving system based on a received satellite time signal — S701

When the satellite time signal is not received, provide the second time source for the second subsystem by using the first crystal oscillator — S702

(51) Int. Cl.
    *G06F 1/06*     (2006.01)
    *H03B 5/30*     (2006.01)

(56) References Cited

U.S. PATENT DOCUMENTS

| | | |
|---|---|---|
| 2009/0238214 A1* | 9/2009 | Hong .................... H04J 3/0688 370/503 |
| 2018/0088584 A1 | 3/2018 | Tascione et al. |
| 2018/0101139 A1 | 4/2018 | Larsen et al. |
| 2019/0286151 A1 | 9/2019 | Palanisamy et al. |
| 2019/0313224 A1 | 10/2019 | Yu et al. |
| 2019/0337545 A1 | 11/2019 | Carlson et al. |

FOREIGN PATENT DOCUMENTS

| | | |
|---|---|---|
| CN | 109462454 A | 3/2019 |
| EP | 1126341 A1 | 8/2001 |
| JP | 2019008709 A | 1/2019 |
| JP | 2020531929 A | 11/2020 |
| JP | 2021524598 A | 9/2021 |

OTHER PUBLICATIONS

Garner, "Proposed Comment Resolution for WG Ballot, P802.1AS-Rev/D7.3, Editor's Report," Revision 1, IEEE 802.1 TSN TG, Total 6 pages, Institute of Electrical and Electronics Engineers, New York, New York (Sep. 13, 2018).

"Timing and Synchronization for Time-Sensitive Applications in Bridged Local Area Networks," IEEE Standard for Local and metropolitan area networks, IEEE Std 802.1AS-2011, Total 292 pages, Institute of Electrical and Electronics Engineers, New York, New York (Mar. 30, 2011).

\* cited by examiner

METHOD AND APPARATUS FOR PROVIDING TIME SOURCE FOR AUTONOMOUS DRIVING

CROSS-REFERENCE TO RELATED APPLICATIONS

This application is a continuation of International Application No. PCT/CN2019/119754, filed on Nov. 20, 2019, the disclosure of which is hereby incorporated by reference in its entirety.

TECHNICAL FIELD

This application relates to the field of time synchronization technologies, and in particular, to a method and an apparatus for providing a time source for autonomous driving.

BACKGROUND

Artificial intelligence (AI) is a theory, a method, a technology, or an application system that simulates, extends, and expands human intelligence by using a digital computer or a machine controlled by the digital computer, to perceive an environment, obtain knowledge, and achieve an optimal result based on the knowledge. Autonomous driving is a mainstream application of artificial intelligence. Autonomous driving technology depends on collaboration among computer vision, radar, monitoring apparatus, global positioning system, and the like, to implement autonomous driving of a motor vehicle without human operation. An autonomous vehicle uses various computing systems to assist in transporting passengers from one location to another. Some autonomous vehicles may require some initial or continuous input from operators (such as navigators, drivers, or passengers). Autonomous driving vehicle allows the operator to switch from a manual operation mode to an autonomous driving mode or a mode between the manual operation mode and the autonomous driving mode. Because the autonomous driving technology does not require human to drive the motor vehicle, a human driving failure can be effectively avoided theoretically, a traffic accident can be reduced, and road transportation efficiency can be improved. Therefore, the autonomous driving technology attracts increasing attention.

In an autonomous driving system, there are a large quantity of heterogeneous compute nodes related to autonomous driving, for example, various sensors, a central compute node, a microcontroller unit (MCU) control node, a power management node, and a security monitoring node. Keeping high-precision time synchronization among these nodes is a basic prerequisite for secure and reliable operation of autonomous driving algorithms such as sensing, positioning, and fusion planning and control. In addition to ensuring time synchronization with the nodes related to autonomous driving, a coordinated universal time service needs to be provided for another service (for example, a management service) related to the autonomous driving system, to meet real time recording requirements of services such as security audit, maintenance and test logs, and driving data migration to cloud in real time.

In the conventional technology, to implement the high-precision time synchronization in the autonomous driving system, there are a plurality of mature time synchronization protocols and standards based on different communication buses and protocol types. Regardless of a protocol or standard based on which the time synchronization is implemented, a stable and reliable global unified time source is required to provide a time synchronization reference for each subnode in the autonomous driving system. In the current autonomous driving system, a global navigation satellite system (GNSS) time signal is usually used as a master clock (that is, a grandmaster clock) of the entire system, to provide a time reference for another node. When the GNSS signal is available, a local clock is adjusted to maintain synchronization with a GNSS time source. When the GNSS signal is unavailable, operation of system time is maintained relying on free oscillation of a crystal oscillator. In a process of tracing the GNSS signal, the GNSS signal may fail to be received, be shielded, or be received incorrectly. In addition, because the GNSS signal is unstable, time jumping often occurs in a driving process of the vehicle, which affects security and reliability of an autonomous driving algorithm, brings a serious potential security risk to the security of autonomous driving, and even leads to a serious traffic accident.

Therefore, it is an urgent issue to provide a stable and reliable global time source reference for the autonomous driving system, ensure secure operation of the autonomous driving system, and meet the requirement of the system for the coordinated universal time.

SUMMARY

Embodiments of the present disclosure provide a method and an apparatus for providing a time source for autonomous driving, to provide a stable and reliable global time source reference for an autonomous driving system, ensure secure operation of the autonomous driving system, and meet a requirement of the system for coordinated universal time.

According to a first aspect, an embodiment of the present disclosure provides an apparatus for providing a time source for autonomous driving, applied to an autonomous driving system of a vehicle, and including: a first processor and a first crystal oscillator connected to the first processor.

The first processor is configured to provide a first time source for a first subsystem of the autonomous driving system by using the first crystal oscillator, and provide a second time source for a second subsystem of the autonomous driving system based on a received satellite time signal. The first subsystem is configured to process driving service-related data of the vehicle, and the second subsystem is configured to process management-related data of the vehicle.

In this embodiment of the present disclosure, independent time sources are provided for different subsystems (including the first subsystem and the second subsystem). The first time source is used to provide a time source for the first subsystem (for example, a driving service subsystem related to autonomous driving decision-making, control, and sensing), and serve as a master clock of the first subsystem. The second time source is configured to provide a time source for the second subsystem (for example, a management subsystem related to security audit, maintenance and test log recording, and driving data migration to cloud), and serve as a master clock of the second subsystem. Each of the two independent clock sources operates in a corresponding clock system to provide reference time for another node in the corresponding clock system. In some embodiments, after the first time source obtains bootup time, even if a GNSS signal can be received, the first time source maintains accuracy of time in the system only by using the first crystal oscillator (which is referred to as a first crystal oscillator in the following, for example, a board high-precision temperature compensated crystal oscillator) without relying on the GNSS signal. When the vehicle can receive the satellite time signal (that is, the GNSS signal), the second time source traces a GNSS clock provided by a satellite. In this embodiment of the present disclosure, the two independent time sources and the corresponding clock systems are provided, so that the time sources are isolated from each other, operate independently, and do not affect each other. In this way, it is ensured that a clock (or referred to as a time source) on which the first subsystem relies is not affected by an external device in any driving scenario, and a continuous and stable time synchronization service is provided for nodes such as an internal algorithm and an external sensor. This embodiment resolves a unreliable, unstable, and insecurity time source in a time synchronization solution of the current autonomous driving system, avoids a problem that time jumping is prone to occur in a time synchronization tracing process, meets time requirements of security audit, digital certificate validity check and driving data migration to cloud, and the like, ensures that the system provides a stable and reliable global time source reference and time service for the autonomous driving system regardless of a scenario in which the autonomous driving vehicle operates, ensures secure operation of the autonomous driving system, and meets a requirement of the system on coordinated universal time.

In a possible implementation, the first processor is further configured to:

when the satellite time signal is not received, provide the second time source for the second subsystem by using the first crystal oscillator. In this embodiment of the present disclosure, when the vehicle cannot receive the satellite signal GNSS signal, the second time source is provided for the corresponding clock system by using the first crystal oscillator. Therefore, when the vehicle cannot receive the satellite signal GNSS signal, receives an incorrect satellite signal, receives an unstable satellite signal, or the like, the time source on which the first subsystem relies is still reliable, and this avoids time instability in the subsystem due to the signal.

In a possible implementation, the apparatus further includes a signal receiving module connected to the first processor. The signal receiving module is configured to provide, when the satellite time signal is received, a reference frequency for the second time source based on the satellite time signal. The first processor is In some embodiments configured to generate the second time source based on the reference frequency, and provide the second time source for the second subsystem. In this embodiment of the present disclosure, a satellite signal (the satellite signal may include the satellite time signal) is received by using the signal receiving module, and GNSS time of the satellite is obtained based on time information included in the received satellite time signal, to ensure that when the satellite time signal is available, time of each distributed subsystem of the autonomous driving system can be adjusted based on the coordinated universal time, to prevent a time error caused by a crystal oscillator offset.

In a possible implementation, the apparatus further includes a first clock module connected to the first processor. The first clock module is configured to synchronize a third time source based on the second time source and a preset adjustment periodicity, where the third time source is a time source provided by the first clock module. In this embodiment of the present disclosure, in an autonomous driving process of the vehicle, the second time source (that is, a GNSS clock) is used to periodically adjust the third time source (that is, an RTC clock), to keep the RTC clock synchronized with the GNSS clock. In this way, after each bootup of the vehicle, a time difference between time of the autonomous driving system and UTC time is small, and this effectively prevents infinite time drift of the first time source.

In a possible implementation, the first processor is further configured to:

determine frequency ratios of three time sources, where the frequency ratios of the three time sources include a first frequency ratio of the first time source to the second time source, a second frequency ratio of the first time source to the third time source, and a third frequency ratio of the second time source to the third time source;

determine a frequency ratio difference of any two of the three time sources based on the frequency ratios of the three time sources and a historical frequency ratio corresponding to any two of the three time sources, where the frequency ratio differences of the three time sources include a first frequency ratio difference between the first frequency ratio and a historical first frequency ratio, a second frequency ratio difference between the second frequency ratio and a historical second frequency ratio, and a third frequency ratio difference between the third frequency ratio and a historical third frequency ratio; and determine, based on the first frequency ratio difference, the second frequency ratio difference, and the third frequency ratio difference, that a frequency of a crystal oscillator corresponding to a target time source in the first time source, the second time source, or the third time source offsets from a preset frequency range.

In this embodiment of the present disclosure, frequency ratio changes of the three groups of clocks (that is, the three time sources, including the first time source, the second time source, and the third time source) are collected periodically based on a preset algorithm, to monitor an operating status of a board crystal oscillator. Whether the crystal oscillator of one of the three clocks is faulty is determined to monitor whether the three time sources are reliable.

In a possible implementation, the first processor is In some embodiments configured to:

determine the first frequency ratio FR1, the second frequency ratio FR2, and the third frequency ratio FR3 according to the following formulas:

$$FR1 = \frac{OS\_CLK_{Frequency}}{GNSS\_CLK_{Frequency}}$$

$$FR2 = \frac{OS\_CLK_{Frequency}}{RTC\_CLK_{Frequency}}$$

$$FR3 = \frac{GNSS\_CLK_{Frequency}}{RTC\_CLK_{Frequency}}.$$

$OS\_CLK_{Frequency}$ is a clock frequency of the first time source, $GNSS\_CLK_{Frequency}$ is a clock frequency of the second time source, and $RTC\_CLK_{Frequency}$ is a clock frequency of the third time source.

In this embodiment of the present disclosure, the clock frequency of the first time source, the clock frequency of the second time source, and the clock frequency of the third time source are first determined, and then the three groups of frequency ratios of the first time source, the second time source, and the third time source are determined according to the foregoing formula. An offset between the three time sources and the historical frequency ratios can be determined based on the frequency ratios and the latest historical frequency ratios, to find out an invalid time source with a large offset.

In a possible implementation, the first processor is in some embodiments configured to:
determine the first frequency ratio difference ΔFR1, the second frequency ratio difference ΔFR1, and the third frequency ratio difference ΔFR3 according to the following formulas:

$$\Delta FR1 = abs(FR1 - FR1_{AVG})$$
$$\Delta FR2 = abs(FR2 - FR2_{AVG})$$
$$\Delta FR3 = abs(FR3 - FR3_{AVG}).$$

$abs(FR1-FR1_{AVG})$ is an absolute value of a difference between the first frequency ratio and the historical first frequency ratio, $abs(FR2-FR2_{AVG})$ is an absolute value of a difference between the second frequency ratio and the historical second frequency ratio, and $abs(FR3-FR3_{AVG})$ is an absolute value of a difference between the third frequency ratio and the historical third frequency ratio.

$$\Delta FR1 = abs(FR1 - FR1_{AVG})$$
$$\Delta FR2 = abs(FR2 - FR2_{AVG})$$
$$\Delta FR3 = abs(FR3 - FR3_{AVG}).$$

In this embodiment of the present disclosure, after the three groups of frequency ratios are calculated, an offset degree of a calculated current frequency ratio from a historical average frequency ratio is determined based on a historical frequency ratio difference corresponding to the frequency ratio. A time source with a most obvious offset degree is determined as an invalid time source based on the offset degree and a voting principle. This is favorable for adjusting the time source.

In a possible implementation, the first processor is further configured to:
determine a $k^{th}$ first frequency ratio, a $k^{th}$ second frequency ratio, and a $k^{th}$ third frequency ratio based on a preset measurement periodicity, until N first frequency ratios, N second frequency ratios, and N third frequency ratios are determined, where 0<k≤N, and k is an integer; and
determine, based on the N first frequency ratios, the N second frequency ratios, and the N third frequency ratios, historical frequency ratios corresponding to the three groups of frequency ratios, where the historical frequency ratios corresponding to the three groups of frequency ratios include the historical first frequency ratio corresponding to the first frequency ratio, the historical second frequency ratio corresponding to the second frequency ratio, and the historical third frequency ratio corresponding to the third frequency ratio.
In this embodiment of the present disclosure, the historical frequency ratio corresponding to each group of frequency ratios is calculated based on the plurality of three groups of frequency ratios that are historically collected, and is subsequently used as a comparison with the current frequency ratio.

In a possible implementation, the first processor is in some embodiments configured to:
determine the historical first frequency ratio $FR1_{AVG}$, the historical second frequency ratio $FR2_{AVG}$, and the historical third frequency ratio $FR3_{AVG}$ according to the following formulas:

$$FR1_{AVG} = \frac{fr1_1 + fr1_2 + fr1_3 + \ldots + fr1_N}{N}$$
$$FR2_{AVG} = \frac{fr2_1 + fr2_2 + fr2_3 + \ldots + fr2_N}{N}$$
$$FR3_{AVG} = \frac{fr3_1 + fr3_2 + fr3_3 + \ldots + fr3_N}{N}.$$

$fr1_1$, $fr1_2$, $fr1_3$, ..., and $fr1_N$ are respectively a $1^{st}$ first frequency ratio, a $2^{nd}$ first frequency ratio, a $3^{rd}$ first frequency ratio, ..., and an $N^{th}$ first frequency ratio, $fr2_1$, $fr2_2$, $fr2_3$, ..., and $fr2_N$ are respectively a $1^{st}$ second frequency ratio, a $2^{nd}$ second frequency ratio, a $3^{rd}$ second frequency ratio, ..., and an $N^{th}$ second frequency ratio, and $fr3_1$, $fr3_2$, $fr3_3$, ..., and $fr3_N$ are respectively a $1^{st}$ third frequency ratio, a $2^{nd}$ third frequency ratio, a $3^{rd}$ third frequency ratio, ..., and an $N^{th}$ third frequency ratio.

In this embodiment of the present disclosure, a plurality of historical frequency ratios corresponding to each group of frequency ratios are first accumulated according to the foregoing formula, and then a sum of the accumulated historical frequency ratios is divided by a quantity of samples, to obtain an accurate historical frequency ratio corresponding to each group of frequency ratios. Whether the frequency ratios of the current three time sources are normal is determined based on the historical frequency ratios, to find out an abnormal time source that offsets from the range.

In a possible implementation, the apparatus further includes a second processor connected to the first processor. The second processor is a backup processor of the first processor, and is further connected to a second crystal oscillator and a second clock module. The second crystal oscillator is a backup crystal oscillator of the first crystal oscillator, and the second clock module is a backup module of the first clock module. In this embodiment of the present disclosure, a backup system-on-a-chip (including a backup processor (that is, the second processor), a temperature compensated crystal oscillator (that is, the second crystal oscillator), an RTC clock chip (that is, the second clock module), and the like) is disposed to provide a dual-chip system redundancy and backup root clock solution. To be specific, generally, the backup processor is in a silent state. When a master/backup processor switchover occurs, the backup processor takes over the master processor to provide the clock service for another node in the corresponding system.

In a possible implementation, the first subsystem is configured to process the driving service-related data of the vehicle, and the second subsystem is configured to process the management-related data of the vehicle. In this embodiment of the present disclosure, the driving service-related data of the vehicle includes data processed by or related to various sensors, a central compute node, an MCU control node, a power management node, and a security monitoring node. The management-related data includes data related to real time, such as security audit, digital certificate validity check, and driving data migration to cloud in real time. The first subsystem is in some embodiments configured to execute driving service logic of core algorithms of the autonomous driving system, such as autonomous driving sensing, convergence, path planning, and vehicle control command generation and delivery. The second subsystem is in some embodiments configured to deliver configuration data of an autonomous driving service, and monitor and record service logic related an operating status of the autonomous driving service, such as device management, log recording, vehicle-mounted black box, and security audit.

In a possible implementation, the first crystal oscillator is a temperature compensated crystal oscillator. In this embodiment of the present disclosure, when no satellite time signal is received, a precision oscillation frequency is provided for the target time source (for example, the first time source) by using the board high-precision temperature compensated crystal oscillator, for providing an input pulse signal of a clock.

According to a second aspect, an embodiment of the present disclosure provides a method for providing a time source for autonomous driving, where the method is applied to an autonomous driving system of a vehicle, and includes:

providing a first time source for a first subsystem of the autonomous driving system by using a first crystal oscillator, and providing a second time source for a second subsystem of the autonomous driving system based on a received satellite time signal, where the first subsystem is configured to process driving service-related data of the vehicle, and the second subsystem is configured to process management-related data of the vehicle.

In a possible implementation, the method further includes:

when the satellite time signal is not received, providing the second time source for the second subsystem by using the first crystal oscillator.

In a possible implementation, the providing a second time source for a second subsystem of the autonomous driving system based on a received satellite time signal includes:

generating the second time source by using the satellite time signal as a reference frequency of the second time source, where the satellite time signal is received by using a signal receiving module; and providing the second time source for the second subsystem.

In a possible implementation, the method further includes:

synchronizing a third time source based on the second time source and a preset adjustment periodicity, where the third time source is a time source provided by a first clock module.

In a possible implementation, the method further includes:

determining frequency ratios of three time sources, where the frequency ratios of the three time sources include a first frequency ratio of the first time source to the second time source, a second frequency ratio of the first time source to the third time source, and a third frequency ratio of the second time source to the third time source;

determining a frequency ratio difference of any two of the three time sources based on the frequency ratios of the three time sources and a historical frequency ratio corresponding to any two of the three time sources, where the frequency ratio differences of the three time sources include a first frequency ratio difference between the first frequency ratio and a historical first frequency ratio, a second frequency ratio difference between the second frequency ratio and a historical second frequency ratio, and a third frequency ratio difference between the third frequency ratio and a historical third frequency ratio; and determining, based on the first frequency ratio difference, the second frequency ratio difference, and the third frequency ratio difference, that a frequency of a crystal oscillator corresponding to a target time source in the first time source, the second time source, or the third time source offsets from a preset frequency range.

In a possible implementation, the determining frequency ratios of three time sources includes:

determining the first frequency ratio FR1, the second frequency ratio FR2, and the third frequency ratio FR3 according to the following formulas:

$$FR1 = \frac{OS\_CLK_{Frequency}}{GNSS\_CLK_{Frequency}}$$

$$FR2 = \frac{OS\_CLK_{Frequency}}{RTC\_CLK_{Frequency}}$$

$$FR3 = \frac{GNSS\_CLK_{Frequency}}{RTC\_CLK_{Frequency}}.$$

$OS\_CLK_{Frequency}$ is a clock frequency of the first time source, $GNSS\_CLK_{Frequency}$ is a clock frequency of the second time source, and $RTC\_CLK_{Frequency}$ is a clock frequency of the third time source.

In a possible implementation, the determining a frequency ratio difference of any two of the three time sources based on the frequency ratios of the three time sources and a historical frequency ratio corresponding to any two of the three time sources includes:

determining the first frequency ratio difference $\Delta FR1$, the second frequency ratio difference $\Delta FR2$, and the third frequency ratio difference $\Delta FR3$ according to the following formulas:

$$\Delta FR1 = abs(FR1 - FR1_{AVG})$$

$$\Delta FR2 = abs(FR2 - FR2_{AVG})$$

$$\Delta FR3 = abs(FR3 - FR3_{AVG}).$$

$abs(FR1-FR1_{AVG})$ is an absolute value of a difference between the first frequency ratio and the historical first frequency ratio, $abs(FR2-FR2_{AVG})$ is an absolute value of a difference between the second frequency ratio and the historical second frequency ratio, and $abs(FR3-FR3_{AVG})$ is an absolute value of a difference between the third frequency ratio and the historical third frequency ratio.

In a possible implementation, the method further includes:

determining a $k^{th}$ first frequency ratio, a $k^{th}$ second frequency ratio, and a $k^{th}$ third frequency ratio based on a preset measurement periodicity, until N first frequency ratios, N second frequency ratios, and N third frequency ratios are determined, where $0<k\leq N$, and k is an integer; and determining, based on the N first frequency ratios, the N second frequency ratios, and the N third frequency ratios, historical frequency ratios corresponding to the three groups of frequency ratios, where the historical frequency ratios corresponding to the three groups of frequency ratios include the historical first frequency ratio corresponding to the first frequency ratio, the historical second frequency ratio corresponding to the second frequency ratio, and the historical third frequency ratio corresponding to the third frequency ratio.

In a possible implementation, the determining, based on the N first frequency ratios, the N second frequency ratios, and the N third frequency ratios, historical frequency ratios corresponding to the three groups of frequency ratios includes:

determining the historical first frequency ratio $FR1_{AVG}$, the historical second frequency ratio $FR1_{AVG}$, and the historical third frequency ratio $FR3_{AVG}$ according to the following formulas:

$$FR1_{AVG} = \frac{fr1_1 + fr1_2 + fr1_3 + \ldots + fr1_N}{N}$$

$$FR2_{AVG} = \frac{fr2_1 + fr2_2 + fr2_3 + \ldots + fr2_N}{N}$$

$$FR3_{AVG} = \frac{fr3_1 + fr3_2 + fr3_3 + \ldots + fr3_N}{N}.$$

$fr1_1$, $fr1_2$, $fr1_3$, ..., and $fr1_N$ are respectively a $1^{st}$ first frequency ratio, a $2^{nd}$ first frequency ratio, a $3^{rd}$ first frequency ratio, ..., and an $N^{th}$ first frequency ratio, $fr2_1$, $fr2_2$, $fr2_3$, ..., and $fr2_N$ are respectively a $1^{st}$ second frequency ratio, a $2^{nd}$ second frequency ratio, a $3^{rd}$ second frequency ratio, ..., and an $N^{th}$ second frequency ratio, and $fr3_1$, $fr3_2$, $fr3_3$, ..., and $fr3_N$ are respectively a $1^{st}$ third frequency ratio, a $2^{nd}$ third frequency ratio, a $3^{rd}$ third frequency ratio, ..., and an $N^{th}$ third frequency ratio.

In a possible implementation, the first crystal oscillator is a temperature compensated crystal oscillator.

According to a third aspect, an embodiment of the present disclosure provides another apparatus for providing a time source for autonomous driving, including:

a first time source unit, configured to provide a first time source for a first subsystem of an autonomous driving system by using a first crystal oscillator, and provide a second time source for a second subsystem of the autonomous driving system based on a received satellite time signal.

In a possible implementation, the apparatus further includes a second time source unit, configured to:

when the satellite time signal is not received, provide the second time source for the second subsystem by using the first crystal oscillator.

In a possible implementation, the first time source unit is in some embodiments configured to:

generate the second time source by using the satellite time signal as a reference frequency of the second time source, where the satellite time signal is received by using a signal receiving module; and provide the second time source for the second subsystem.

In a possible implementation, the apparatus further includes an adjustment unit, configured to:

synchronize a third time source based on the second time source and a preset adjustment periodicity, where the third time source is a time source provided by a first clock module.

In a possible implementation, the apparatus further includes:

a calculation unit, configured to determine frequency ratios of three time sources, where the frequency ratios of the three time sources include a first frequency ratio of the first time source to the second time source, a second frequency ratio of the first time source to the third time source, and a third frequency ratio of the second time source to the third time source;

a comparison unit, configured to determine a frequency ratio difference of any two of the three time sources based on the frequency ratios of the three time sources and historical frequency ratios corresponding to the three time sources, where the frequency ratio differences of the three time sources include a first frequency ratio difference between the first frequency ratio and a historical first frequency ratio, a second frequency ratio difference between the second frequency ratio and a historical second frequency ratio, and a third frequency ratio difference between the third frequency ratio and a historical third frequency ratio; and a determining unit, configured to determine, based on the first frequency ratio difference, the second frequency ratio difference, and the third frequency ratio difference, that a frequency of a crystal oscillator corresponding to a target time source in the first time source, the second time source, or the third time source offsets from a preset frequency range.

In a possible implementation, the calculation unit is in some embodiments configured to:

determine the first frequency ratio FR1, the second frequency ratio FR2, and the third frequency ratio FR3 according to the following formulas:

$$FR1 = \frac{OS\_CLK_{Frequency}}{GNSS\_CLK_{Frequency}}$$

$$FR2 = \frac{OS\_CLK_{Frequency}}{RTC\_CLK_{Frequency}}$$

$$FR3 = \frac{GNSS\_CLK_{Frequency}}{RTC\_CLK_{Frequency}}.$$

$OS\_CLK_{Frequency}$ is a clock frequency of the first time source, $GNSS\_CLK_{Frequency}$ is a clock frequency of the second time source, and $RTC\_CLK_{Frequency}$ is a clock frequency of the third time source.

In a possible implementation, the comparison unit is in some embodiments configured to:

determine the first frequency ratio difference $\Delta FR1$, the second frequency ratio difference $\Delta FR2$, and the third frequency ratio difference $\Delta FR3$ according to the following formulas:

$$\Delta FR1 = abs(FR1 - FR1_{AVG})$$

$$\Delta FR2 = abs(FR2 - FR2_{AVG})$$

$$\Delta FR3 = abs(FR3 - FR3_{AVG}).$$

$abs(FR1-FR1_{AVG})$ is an absolute value of a difference between the first frequency ratio and the historical first frequency ratio, $abs(FR2-FR2_{AVG})$ is an absolute value of a difference between the second frequency ratio and the historical second frequency ratio, and abs(FR3–

$FR3_{AVG}$) is an absolute value of a difference between the third frequency ratio and the historical third frequency ratio.

In a possible implementation, the apparatus further includes:

a measurement unit, configured to determine a $k^{th}$ first frequency ratio, a $k^{th}$ second frequency ratio, and a $k^{th}$ third frequency ratio based on a preset measurement periodicity, until N first frequency ratios, N second frequency ratios, and N third frequency ratios are determined, where $0<k\leq N$, and k is an integer; and a historical frequency ratio unit, configured to determine, based on the N first frequency ratios, the N second frequency ratios, and the N third frequency ratios, historical frequency ratios corresponding to the three groups of frequency ratios, where the historical frequency ratios corresponding to the three groups of frequency ratios include the historical first frequency ratio corresponding to the first frequency ratio, the historical second frequency ratio corresponding to the second frequency ratio, and the historical third frequency ratio corresponding to the third frequency ratio.

In a possible implementation, the historical frequency ratio unit is in some embodiments configured to:

determine the historical first frequency ratio $FR1_{AVG}$, the historical second frequency ratio $FR1_{AVG}$, and the historical third frequency ratio $FR3_{AVG}$ according to the following formulas:

$$FR1_{AVG} = \frac{fr1_1 + fr1_2 + fr1_3 + \ldots + fr1_N}{N}$$

$$FR2_{AVG} = \frac{fr2_1 + fr2_2 + fr2_3 + \ldots + fr2_N}{N}$$

$$FR3_{AVG} = \frac{fr3_1 + fr3_2 + fr3_3 + \ldots + fr3_N}{N}$$

$fr1_1$, $fr1_2$, $fr1_3$, ..., and $fr1_N$ are respectively a $1^{st}$ first frequency ratio, a $2^{nd}$ first frequency ratio, a $3^{rd}$ first frequency ratio, ..., and an $N^{th}$ first frequency ratio, $fr2_1$, $fr2_2$, $fr2_3$, ..., and $fr2_N$ are respectively a $1^{st}$ second frequency ratio, a $2^{nd}$ second frequency ratio, a $3^{rd}$ second frequency ratio, ..., and an $N^{th}$ second frequency ratio, and $fr3_1$, $fr3_2$, $fr3_3$, ..., and $fr3_N$ are respectively a $1^{st}$ third frequency ratio, a $2^{nd}$ third frequency ratio, a $3^{rd}$ third frequency ratio, ..., and an $N^{th}$ third frequency ratio.

In a possible implementation, the first crystal oscillator is a temperature compensated crystal oscillator.

According to a fourth aspect, this application provides an apparatus for providing a time source for autonomous driving. The apparatus for providing a time source has a function of implementing any one of the foregoing methods for providing a time source. The function may be implemented by hardware, or may be implemented by hardware executing corresponding software. The hardware or the software includes one or more modules corresponding to the foregoing function.

According to a fifth aspect, this application provides a terminal. The terminal includes a processor, and the processor is configured to support the terminal in performing a corresponding function in the method for providing a time source provided in the second aspect. The terminal may further include a memory, and the memory is configured to be coupled to the processor and stores necessary program instructions and data of the terminal. The terminal may further include a communications interface, configured to perform communication between the terminal and another device or communications network.

According to a sixth aspect, this application provides a chip system. The chip system may perform any method in the second aspect, so that a related function is implemented. In a possible design, the chip system further includes a memory. The memory is configured to store necessary program instructions and data. The chip system may include a chip, or may include a chip and another discrete component.

According to a seventh aspect, this application provides a vehicle. The vehicle is equipped with the apparatus for providing a time source and the corresponding autonomous driving system in the first aspect, and may be configured to perform any method in the second aspect, so that a related function is implemented.

BRIEF DESCRIPTION OF DRAWINGS

To describe the technical solutions in embodiments of the present disclosure more clearly, the following briefly describes the accompanying drawings used in describing embodiments.

DESCRIPTION OF EMBODIMENTS

Figure 1:
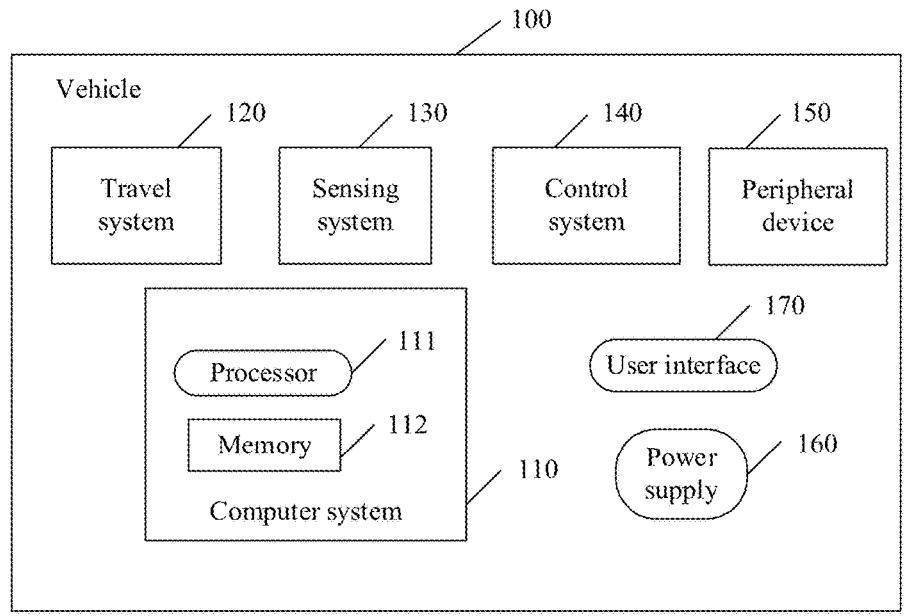
FIG. 1 is a schematic diagram of an architecture of an autonomous driving vehicle according to an embodiment of the present disclosure.

The following describes embodiments of the present disclosure with reference to the accompanying drawings in embodiments of the present disclosure.

In the specification, claims, and accompanying drawings of this application, the terms "first", "second", "third", "fourth", and the like are intended to distinguish between different objects but do not indicate a particular order. In addition, the terms "including", "having", and any other variant thereof are intended to cover non-exclusive inclusion. For example, a process, method, system, product, or device that includes a series of steps or units is not limited to the listed steps or units, but in some embodiments further includes an unlisted step or unit, or in some embodiments further includes another inherent step or unit of the process, method, product, or device.

"Embodiment" mentioned in this specification means that a particular characteristic, structure, or feature described with reference to embodiments may be included in at least one embodiment of this application. The phrase occurred at different positions in the specification does not necessarily refer to a same embodiment, or an independent or alternative embodiment exclusive of another embodiment. A person skilled in the art understands, in explicit and implicit manners, that an embodiment described in this application may be combined with another embodiment.

Terms such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both an application that runs on a computing device and a computing device may be components. One or more components may reside within a process and/or a thread of execution, and a component may be located on one computer and/or distributed between two or more computers.

First, some terms in this application are explained and described to facilitate understanding by a person skilled in the art.

(1) A crystal oscillator is referred to as a crystal oscillator for short, and is a crystal element in which an integrated circuit is added into a package to form an oscillation circuit. It should be noted that the crystal oscillator mentioned in this application refers to the foregoing crystal oscillator. The crystal oscillator includes a non-temperature compensated crystal oscillator, a temperature compensated crystal oscillator (Temperature Compensate X'tal (crystal) Oscillator, TCXO), a voltage-controlled crystal oscillator, a constant temperature-controlled crystal oscillator, and the like. The temperature compensated crystal oscillator (referred to as the temperature compensated crystal oscillator) is a quartz crystal oscillator that reduces, through an additional temperature compensated circuit, an oscillation frequency variation amount caused by an ambient temperature change.

(2) Coordinated universal time (CUT) is also called world unified time, world standard time, or international coordinated time, and can also be abbreviated as UTC due to different abbreviations in English and French. The UTC or CUT mentioned in this application refers to the foregoing coordinated universal time. The coordinated universal time (UTC) is a time measurement system that uses a length of an atomic second as the basis and is close to universal time as far as possible.

(3) A real-time clock (RTC) is an integrated circuit, is usually referred to as a clock chip or a real-time clock chip, and provides a precision time reference for an electronic system. At present, most real-time clock chips use crystal oscillators with high precision as clock sources. Some clock chips need to be powered by batteries so that the clock chips can still operate when main power supply fails.

(4) A system-on-a-chip (SoC) is a technology in which a complete system is integrated on a single chip, and all or a part of necessary electronic circuits are grouped. The complete system generally includes a processor, a memory, a peripheral circuit, and the like. The SoC is developed in parallel with other technologies, such as a silicon-on-insulator, and can provide an enhanced clock frequency, to reduce power consumption of a microchip.

(5) A multi-core CPU integrates a plurality of CPU cores into a single chip, and each CPU core is an independent processor. Each CPU core can have its own cache, or the plurality of CPU cores can share a same cache.

(6) A serial peripheral interface (SPI) is a high-speed, full-duplex, synchronous communications bus, and occupies only four wires on a pin of a chip. This saves the pins of the chip, saves space for layout of a printed circuit board, and provides convenience.

(7) An inter-integrated circuit bus (IIC) is a serial data bus, and includes only two signal cables, one is a bidirectional data cable, and the other is a clock cable. The two cables may be connected to a plurality of devices. Each IIC device (mostly) has a fixed address that only responds if values transmitted on the two cables are equal to the fixed address of the IIC device. Generally, IIC devices are classified into primary devices and secondary devices.

(8) A controller area network (CAN) is an internationally standardized serial communication protocol specified by the International Organization for Standardization. A distributed control system based on a CAN bus has following advantages: Real-time data communication between nodes of the network is strong: a development periodicity is short: an international standard field bus is formed; and the like.

(9) A local area network switch (LAN switch) is a device used for data exchange in a switched local area network. In the switched local area network, if a source node and a destination node that send data do not conflict, the data is sent in parallel, and a data transmission rate is increased.

(10) A generalized Precision Time Protocol (gPTP) is defined in IEEE 802.1AS. Based on the precision time protocol, some features are added to improve time precision and lock time.

(11) A pulse per second (PPS): In a global positioning system GPS, one GPS PPS pulse signal is generated per second. The PPS pulse signal indicates time of an entire second, and the time is usually indicated by a rising edge of the PPS pulse signal. The GPS can provide UTC time. When a user receives the UTC time, there is a delay. For accurate time receiving, the rising edge of the PPS pulse signal is introduced to indicate the time of the entire second of the UTC. Precision can reach a nanosecond level, and there is no accumulated error.

(12) Time-sensitive networking (TSN) is also known as time-sensitive networking, and is a series of standards developed by a TSN working group in an IEEE 802.1 working group. This standard defines a mechanism for time-sensitive transmission over Ethernet.

(13) An application programming interface (API) is some predefined functions, or a convention for connecting different components of a software system. The application programming interface aims to provide an application program and a developer with a software-based or hardware-based capability to access a set of processes, without accessing source code or understanding details of an internal working mechanism. A kernel mode and a user mode are two operating levels of an operating system. The kernel mode has a higher permission and the user mode has a lower permission. Therefore, a kernel mode interface has a higher permission and a user mode interface has a lower permission.

(14) A complex programmable logic device (CPLD) is a high-density, high-speed, and low-power programmable logic device formed by using programming technologies such as a CMOS EPROM, an EEPROM, a flash memory, and an SRAM.

The following first describes an application architecture on which embodiments of the present disclosure are based. FIG. 1 is a schematic diagram of an architecture of an autonomous vehicle according to an embodiment of the present disclosure. A method and an apparatus for providing a time source that are provided in this application may be applied to the architecture. The architecture of the vehicle 100 may include a computer system 110 (including a processor 111 and a memory 112), a travel system 120, a sensing system 130, a control system 140, a peripheral device 150, a user interface 170, a power supply 160, and the like. Components shown in FIG. 1 are merely example descriptions, and an actual architecture may include but be limited to the foregoing components. The method and apparatus for providing a time source may be applied to the processor 111 in this architecture. The memory 112 may store a related program or code for performing the method for providing a time source. In some embodiments, the vehicle 100 may include more or fewer subsystems, and each subsystem may include a plurality of elements. In addition, each subsystem and element of the vehicle 100 may be interconnected in a wired or wireless manner.

The travel system 102 may include a component that provides power for the vehicle 100 to move. In an embodiment, the travel system 102 may include an engine, an energy source, a transmission apparatus, and wheels/tires. The engine may be an internal combustion type engine, a motor, an air compression engine, or another type of engine combination, for example, a hybrid engine including a gasoline engine and a motor, or a hybrid engine including an internal combustion type engine and an air compression engine. The engine converts the energy source into mechanical energy: The energy source may include gasoline, diesel, another petroleum-based fuel, propane, another compressed gas-based fuel, anhydrous alcohol, a solar panel, a battery, and another power source. The energy source may also provide energy to another system of the vehicle 100. The transmission apparatus may transfer mechanical power from the engine to the wheels. The transmission apparatus may include a gearbox, a differential, and a drive shaft. In an embodiment, the transmission apparatus may further include another device, for example, a clutch. The drive shaft may include one or more shafts that may be coupled to one or more wheels.

The sensing system 130 may include several sensors that sense information about an ambient environment of the vehicle 100. For example, the sensor system 130 may include a positioning system (the positioning system may be a GPS system, a BeiDou system, or another positioning system), an inertial measurement unit (IMU), a radar, a laser rangefinder, and a camera. The sensing system 130 may further include sensors (for example, an in-vehicle air quality monitor, a fuel gauge, and an oil temperature gauge) of an internal system of the monitored vehicle 100. Sensor data from one or more of these sensors may be used for detecting an object and corresponding characteristics (a position, a shape, a direction, a speed, and the like) of the object. Such detection and recognition are key functions of a secure operation of the autonomous vehicle 100. The positioning system may be configured to estimate a geographic location of the vehicle 100. The IMU is configured to sense location and orientation changes of the vehicle 100 based on an inertial acceleration. In an embodiment, the IMU may be a combination of an accelerometer and a gyroscope. The radar may sense an object in the ambient environment of the vehicle 100 by using a radio signal. In some embodiments, in addition an object, the radar may be further configured to sense a speed and/or a moving direction of the object. The laser rangefinder may sense, by using a laser, an object in an environment in which the vehicle 100 is located. In some embodiments, the laser rangefinder may include one or more laser sources, a laser scanner, one or more detectors, and another system component. The camera may be configured to capture a plurality of images of the ambient environment of the vehicle 100. The camera may be a static camera or a video camera.

The control system 140 controls operations of the vehicle 100 and components of the vehicle 100. The control system 140 may include various components, including a steering system, a throttle, a brake unit, a computer vision system, a route control system, and an obstacle avoidance system. The steering system is operable to adjust an advancing direction of the vehicle 100. For example, in an embodiment, the steering system may be a steering wheel system. The throttle is configured to control an operating speed of the engine and further control a speed of the vehicle 100. The braking unit is configured to control the vehicle 100 to decelerate. The brake unit may use friction to slow down the wheels. In another embodiment, the brake unit may convert kinetic energy of the wheels into a current. The brake unit may alternatively reduce a rotation speed of the wheels by using another form, to control the speed of the vehicle 100. The computer vision system may operate to process and analyze the images captured by the camera to recognize objects and/or features in the environment of the vehicle 100. The objects and/or features may include traffic signals, road boundaries, and obstacles. The computer vision system may use an object recognition algorithm, a structure from motion (SFM) algorithm, video tracking, and other computer vision technologies. In some embodiments, the computer vision system may be configured to draw a map for an environment, track an object, estimate an object speed, and the like. The route control system is configured to determine a running route of the vehicle 100. In some embodiments, the route control system may determine a driving route for the vehicle 100 with reference to data from the sensors, the GPS, and one or more predetermined maps.

The obstacle avoidance system is configured to recognize, evaluate, and avoid or bypass, in another manner, a potential obstacle in an environment of the vehicle 100. Certainly, for example, the control system 140 may add or alternatively include components in addition to those shown and described. Alternatively, the control system 140 may not include some of the foregoing components.

The vehicle 100 interacts with an external sensor, another vehicle, another computer system, or a user by using the peripheral device 150. The peripheral device 150 may include a wireless communications system, a vehicle-mounted computer, a microphone, and/or a speaker. In some embodiments, the peripheral device 150 provides a means for a user of the vehicle 100 to interact with the user interface 170. For example, the vehicle-mounted computer may provide information for the user of the vehicle 100. The user interface 170 may further operate the vehicle-mounted computer to receive input from the user. The vehicle-mounted computer may perform an operation by using a touchscreen. In another case, the peripheral device 150 may provide a means for the vehicle 100 to communicate with another device located in the vehicle. For example, the microphone may receive audio (for example, a voice command or other audio input) from the user of the vehicle 100. Likewise, the speaker may output audio to the user of the vehicle 100. The wireless communications system may communicate wirelessly with one or more devices directly or over a communications network. For example, the wireless communications system may perform communication through a 3G cellular network such as CDMA. EVDO, or a GSM/GPRS, perform communication through a 4G cellular network such as LTE, or perform communication through a 5G cellular network. The wireless communications system 146 may communicate with a wireless local area network (WLAN) by using Wi-Fi. In some embodiments, the wireless communications system may directly communicate with a device through an infrared link, Bluetooth, or ZigBee. Other wireless protocols, for example, various vehicle communications systems, such as the wireless communications system, may include one or more dedicated short-range communications (dedicated short-range communications, DSRC) devices, and these devices may include public and/or private data communication between the vehicle and/or roadside stations.

The power supply 160 may provide power to various components of the vehicle 100. In an embodiment, the power supply 160 may be a rechargeable lithium-ion or lead-acid battery: One or more battery packs of the battery may be configured to provide power to the various components of the vehicle 100. In some embodiments, the power supply 160 and the energy source may be implemented together, as in some battery electric vehicles.

The user interface 170 is configured to provide information to or receive information from the user of the vehicle 100. In some embodiments, the user interface 170 may include one or more input/output devices in a set of peripheral devices 150, for example, a wireless communications system, a vehicle-mounted computer, a microphone, and a speaker.

Some or all of functions of the vehicle 100 are controlled by the computer system 110. The computer system 110 may include at least one processor 111. The processor 111 executes instructions stored in a non-transient computer-readable medium such as a data storage apparatus. The computer system 110 may alternatively be a plurality of computing devices that control an individual component or the subsystem of the vehicle 100 in a distributed manner. The processor 111 may be any conventional processor, for example, a commercially available CPU. Alternatively, the processor may be a dedicated device such as an ASIC or another hardware-based processor. A person of ordinary skill in the art should understand that the processor, the computer, or the memory may actually include a plurality of processors, computers, or memories that may or may not be stored in a same physical housing. For example, the memory may be a hard disk drive or another storage medium located in a housing different from that of the computer. Thus, it is understood that references to the processor or the computer include references to a set of processors or computers or memories that may or may not operate in parallel. Different from using a single processor to perform the steps described herein, some components such as a steering component and a deceleration component each may include a respective processor. The processor performs only computation related to a component-specific function.

In various aspects described herein, the processor may be located far away from the vehicle and perform wireless communication with the vehicle. In another aspect, some of processes described herein are performed on a processor disposed inside the vehicle, while others are performed by a remote processor. The processes include necessary steps for performing a single operation.

The computer system 110 may control the functions of the vehicle 100 based on input received from various subsystems (for example, the travel system 120, the sensing system 130, and the control system 140) and from the user interface 170. For example, the computer system 110 may use an input from the control system 140 to control the steering unit to avoid obstacles detected by the sensing system 130 and the obstacle avoidance system. In some embodiments, the computer system 112 may operate to provide control over many aspects of the vehicle 100 and the subsystems of the vehicle 100.

In some embodiments, one or more of the foregoing components may be installed separately from or associated with the vehicle 100.

In some embodiments, the foregoing components are merely examples. In actual application, components in the foregoing modules may be added or removed based on an actual requirement. This shall not be construed as a limitation on this embodiment of the present disclosure.

The vehicle 100 may be a car, a truck, a motorcycle, a bus, a boat, an airplane, a helicopter, a lawn mower, a recreational vehicle, a playground vehicle, a construction device, a trolley, a golf cart, a train, a handcart, or the like. This is not in some embodiments In some embodiments limited in this embodiment of the present disclosure.

In some embodiments, the computer system 110 may include a plurality of processors, and different processors process data of different services. For example, a processor A is configured to provide a time source, a processor B is a backup processor of the processor A, and a processor C is configured to calculate data related to an autonomous driving service.

In some embodiments, the computer system may include one processor. The processor is divided into a plurality of processing submodules based on functions, and different submodules are configured to process data of different services. For example, a submodule A is configured to provide a time source, and a submodule B is configured to process data related to a logbook and vehicle security performance.

In some embodiments, the vehicle 100 may include one or more computer systems. For example, a computer system A is a master computer system, and the computer system B is a backup system of the master computer system. In some embodiments, the computer system may be an SoC, that is, a chip integrated with a plurality of functions.

It may be understood that the system in FIG. 1 is merely an example of an application architecture in this embodiment of the present disclosure, and the application architecture in this embodiment of the present disclosure includes but is not limited to the foregoing application architecture.

In the following embodiment of the present disclosure, an example in which two chips (that is, each chip runs one computer system, one is a master computer system (referred to as a master system), and the other is a backup computer system (referred to as a backup system)) are deployed on a circuit board of a vehicle to constitute a master/backup chip is used for description. In this embodiment of the present disclosure, the two chips may be SoCs. The two chips, namely, a master computer system 110 and a backup computer system 110' may be connected through a bus.

Figure 2:
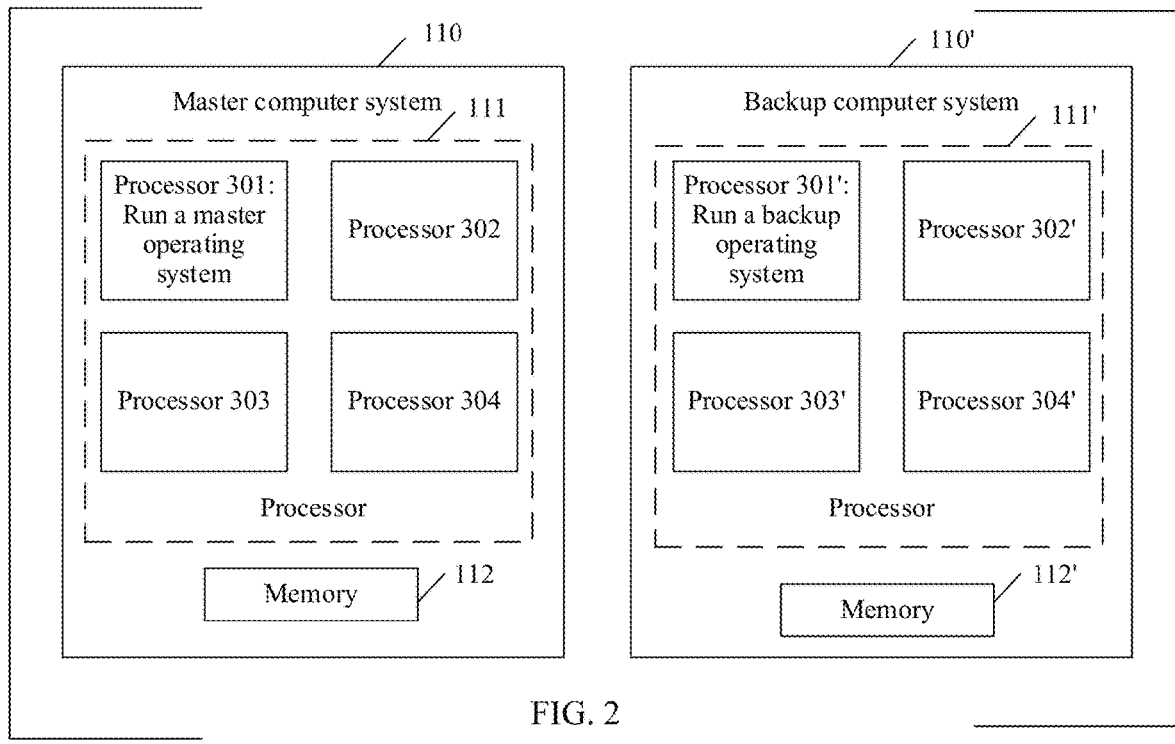
FIG. 2 is a schematic diagram of an autonomous driving hardware architecture according to an embodiment of the present disclosure.

FIG. 2 is a schematic diagram of an autonomous driving hardware architecture according to an embodiment of the present disclosure. As shown in FIG. 2, each chip integrates a plurality of cores (namely, a plurality of processors), for example, a processor 301, a processor 302, a processor 303, and a processor 304 in FIG. 2. The processor 301 in a master system is configured to run an operating system (that is, a master operating system, master OS) running on the master computer system. A processor 301' in a backup system is configured to run an operating system (that is, a backup operating system, backup OS) running on the backup computer system. The processor 303, the processor 304, a processor 303', and a processor 304' are all described as examples, and specific functions are not limited. The processor 302 and a processing 302' are configured to run a same AO OS. The operating system is an operating system on a subsystem that always keeps a power-on operating state in an autonomous driving system. When the master OS and the backup OS of the master system and the backup system are started, the operating system obtains time from a real-time clock of a board RTC and sets the time as bootup time of the master OS and the backup OS. In some embodiments, when the master system is faulty, the backup system may replace the master system. In addition, when the master system operates normally, the backup system may also execute a same computing service as the master system, to verify a calculation result of the master system.

Figure 3:
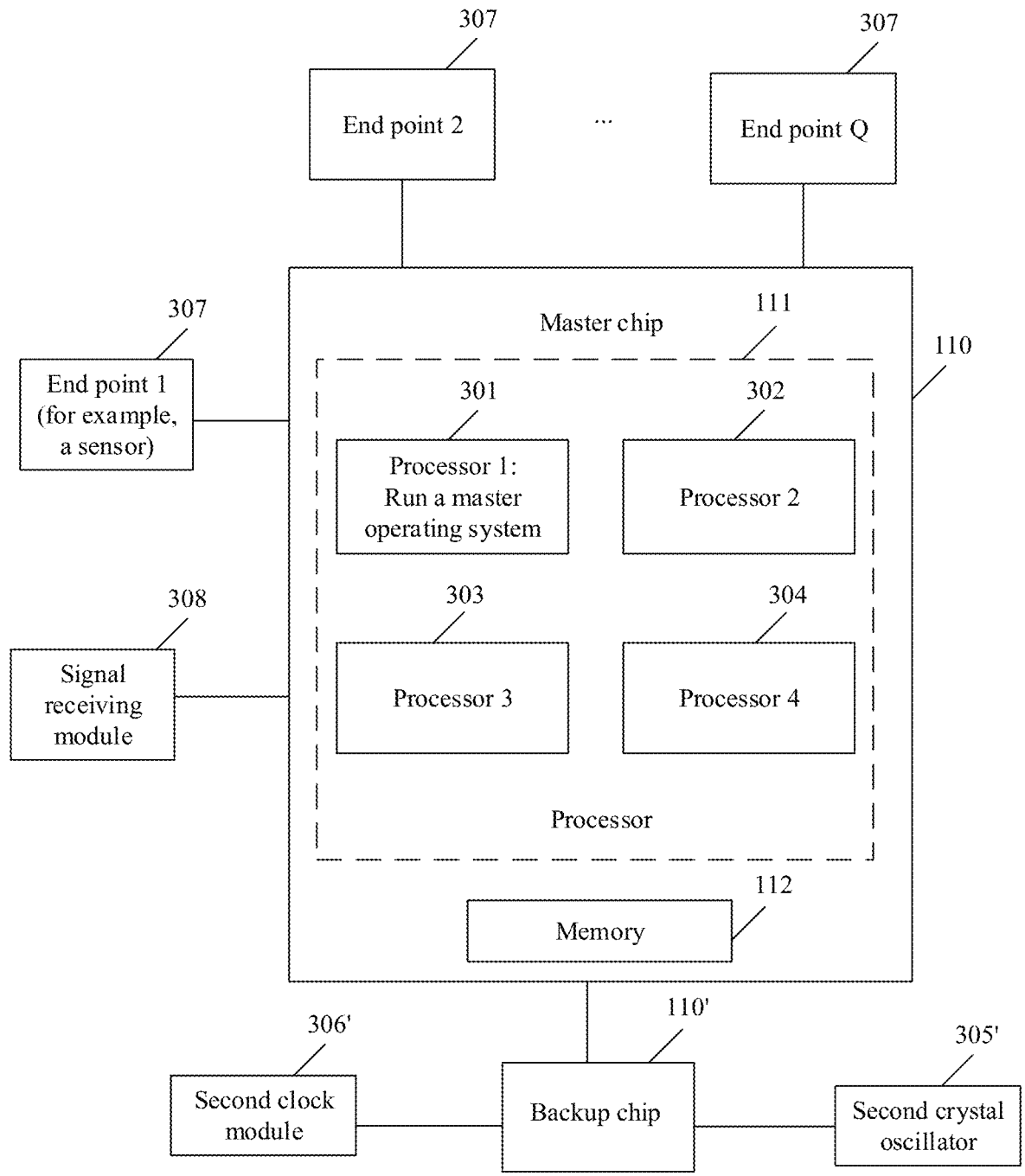
FIG. 3 is a diagram of a hardware logical architecture according to an embodiment of the present disclosure.

With reference to a master/backup system architecture and a specific logical relationship between components in FIG. 2, a hardware logical architecture in embodiments of the present disclosure is described. FIG. 3 is a diagram of a hardware logical architecture according to an embodiment of the present disclosure. As shown in FIG. 3, a master chip (an SoC is used as an example, and the following provides description by using an example in which a backup chip is also an SoC) 110 may include a processor 111 and a memory 112. The processor 111 may include a processor 301 (that is, a processor 1), a processor 302 (that is, a processor 2), a processor 303 (that is, a processor 3), and a processor 304 (that is, a processor 4).

The processor 301 is configured to run a Master OS, and the processor 2 is configured to run an AO OS.

The processor 303 is configured to calculate service data related to autonomous driving. The service data related to autonomous driving includes data processed by or related to various sensors, a central compute node, an MCU control node, a power management node, and a security monitoring node. In some embodiments, the foregoing service data relates to driving service logic that executes core algorithms of an autonomous driving system, such as autonomous driving sensing, convergence, path planning, and vehicle control command generation and delivery.

The processor 304 is configured to calculate management data related to audit, logs, and driving data migration to cloud. The related management data includes data related to real time, such as security audit, digital certificate validity check, and driving data migration to cloud in real time. In some embodiments, the foregoing management data relates to a configuration data delivery process of an autonomous driving service, and related service logic for monitoring and recording an operating status of the autonomous driving service, such as device management, log recording, in-vehicle black box, and security audit.

The master SoC may further include one or more other processors, a memory, and another functional component or module, for example, a graphics processing unit (Graphics Processing Unit, GPU), a random access memory (Random Access Memory, RAM), and an encoder. The master SoC is connected to a signal receiving module (for example, a GNSS module) and an end point 307 (an end point 1, an end point 2, . . . , and an end point Q are enumerated as examples in FIG. 3, where Q is an integer greater than 0). The master SoC provides a time reference for each of a plurality of end points. A specific connection manner is not limited in this embodiment of the present disclosure. The end point may be an end point (End Point, EP) whose time needs to be synchronized, for example, a sensor, for example, a vehicle-mounted laser radar and a millimeter-wave radar, a first crystal oscillator 305 (the first crystal oscillator may be a high-precision temperature compensated crystal oscillator), and a clock module (for example, an RTC real-time clock chip). In some embodiments, the master SoC may alternatively be connected to a backup SoC to perform communication and interaction between chips.

In some embodiments, when a master processor (namely, the master SoC) operates normally, a backup processor (namely, the backup SoC) may operate at the same time, and is configured to process a same service as the master processor. For example, a first time source of the backup SoC traces a first time source of the master SoC, and a time-related calculation result of the backup SoC is compared with a time-related calculation result of the master SoC, to verify time accuracy of the first time source in the master SoC. The first time source of the backup SoC stops tracing the first time source of the master SoC when the master processor is faulty.

It should be noted that, the backup SoC 110' is connected to a temperature compensated crystal oscillator (that is, a second crystal oscillator), an RTC clock chip (that is, a second clock module), and a signal receiving module 308. In addition, the backup SoC is also connected to one or more end points, but does not provide a time reference to each end point EP when the master SoC operates normally.

Based on the hardware logical architecture shown in FIG. 3, the following describes a related hardware structure of the master SoC and a method for providing a time source for autonomous driving in an embodiment of the present disclosure. For a related principle and method in the backup SoC, refer to the master SoC. The backup SoC and a connection between the backup SoC and the master SoC are not described herein again.

Figure 4:
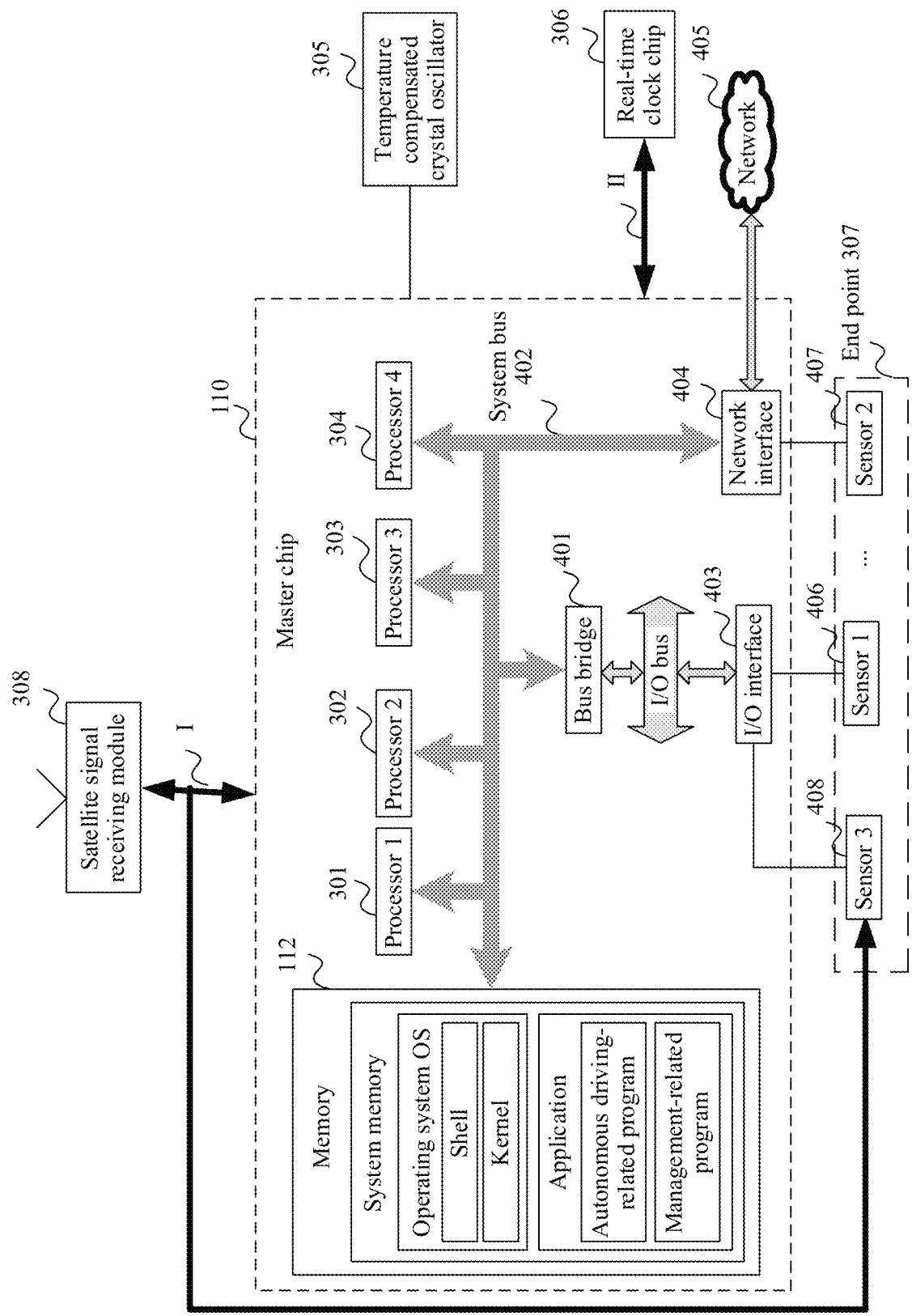
FIG. 4 is a schematic diagram of a hardware structure principle according to an embodiment of the present disclosure.

FIG. 4 is a schematic diagram of a hardware structure principle according to an embodiment of the present disclosure. As shown in FIG. 4, in this embodiment of the present disclosure, a first crystal oscillator is a temperature compensated crystal oscillator, a first clock module is an RTC clock chip (that is, a real-time clock chip), a satellite signal receiving module (or a signal receiving module) may be a GNSS module, and an end point EP is a sensor. In this embodiment of the present disclosure, a hardware structure of the master SoC includes the processor 301, the processor 302, the processor 303, the processor 304, the memory 112, a bus bridge 401, a system bus 402, an I/O interface 403, a network interface 404, and the like. The master SoC is further connected to the GNSS module 308 through I (a dedicated CAN bus) shown in the figure to receive a GNSS signal, connected to an RTC clock chip 306 through II (such as an SPI or IIC bus) shown in the figure to obtain real real time, connected to a sensor 406 through the I/O interface 403, to provide a time reference for the end point 307, for example, a sensor, and connected to the temperature compensated crystal oscillator 305 on a circuit board, to obtain an oscillation frequency of the temperature compensated crystal oscillator, so as to maintain operating of system time. In some embodiments, the master SoC may be further connected to a network through the network interface, to obtain required information or real-time data.

Figure 5:
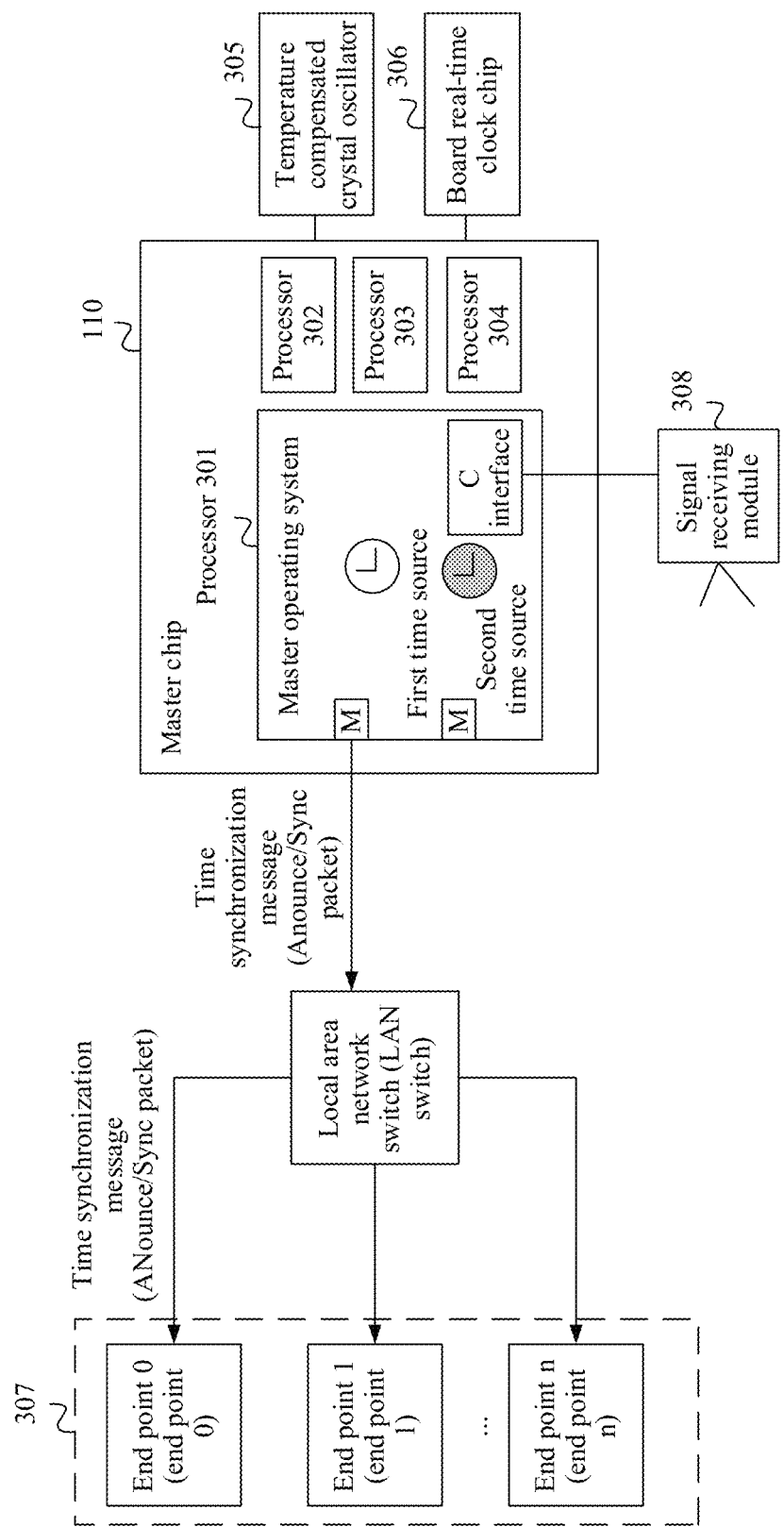
FIG. 5 is a schematic diagram of a principle of providing a time source for autonomous driving according to an embodiment of the present disclosure.

With reference to the hardware structure shown in FIG. 4, the following describes a principle of providing a time source for autonomous driving in an embodiment of the present disclosure. FIG. 5 is a schematic diagram of a principle of providing a time source for autonomous driving according to an embodiment of the present disclosure. As shown in FIG. 5, in this embodiment of the present disclosure, the processor 301, the processor 302 (running an AO OS), the processor 303, the processor 304, the GNSS module (namely, a signal receiving module) 308, the temperature compensated crystal oscillator 305, and the board RTC (namely, a board real-time clock chip) 306 in the master SoC 110 are used as examples for description. Two sets of clocks are deployed in the processor 301 of the master SoC, which are a first time source OS-CLK and a second time source GNSS-CLK. The OS-CLK operates relying on the board temperature compensated crystal oscillator 305 regardless of whether a vehicle can receive a GNSS signal. When the vehicle can obtain the GNSS signal, the GNSS-CLK traces GNSS time provided by a satellite based on the GNSS signal. When the vehicle cannot obtain the GNSS signal, the GNSS-CLK switches, based on a message feedback (the GNSS module is connected to a C interface (namely, a CAN interface, where the CAN interface is represented by the C interface in the following, and this is not be described later)) from the GNSS module, to maintaining normal operating of time in the system by using the temperature compensated crystal oscillator. When the system is started or woken up from a sleep state, the board RTC provides bootup time for the master SoC and the backup SoC. The bootup time is used for setting of OS-CLKs and GNSS-CLKs in the two SoCs. As shown in FIG. 5, the processor 301 sends a time synchronization message (Anounce/Sync packet) to a local area network switch (LAN Switch) through a network interface M (for example, the network interface M is a ten-gigabit Ethernet interface (Ten-GigabitEthernet, XGE). Then, the local area network switch is used as a boundary clock to send the time synchronization message to a plurality of end points, so as to ensure time synchronization of each time point. The processor 301 may further provide a time synchronization message of the OS-CLK for the processor 303, and provide a time synchronization message of the GNSS-CLK for the processor 304. It may be understood that, a time stabilization principle and a structure of the backup SoC are basically the same as those of the master SoC. Details are not described herein again.

Figure 6A:
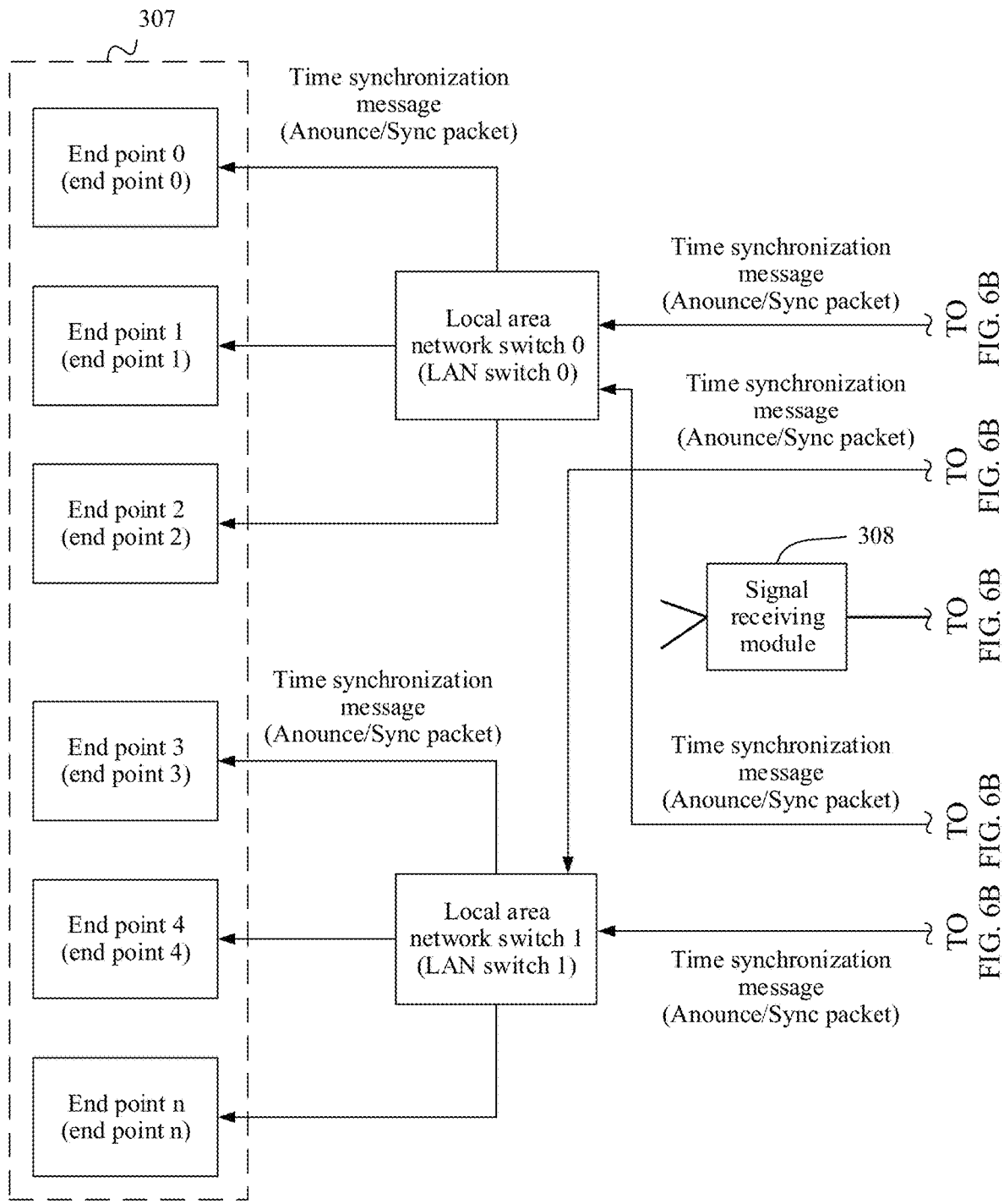
FIG. 6A and FIG. 6B are a schematic diagram of another principle of providing a time source for autonomous driving according to an embodiment of the present disclosure.
Figure 6B:
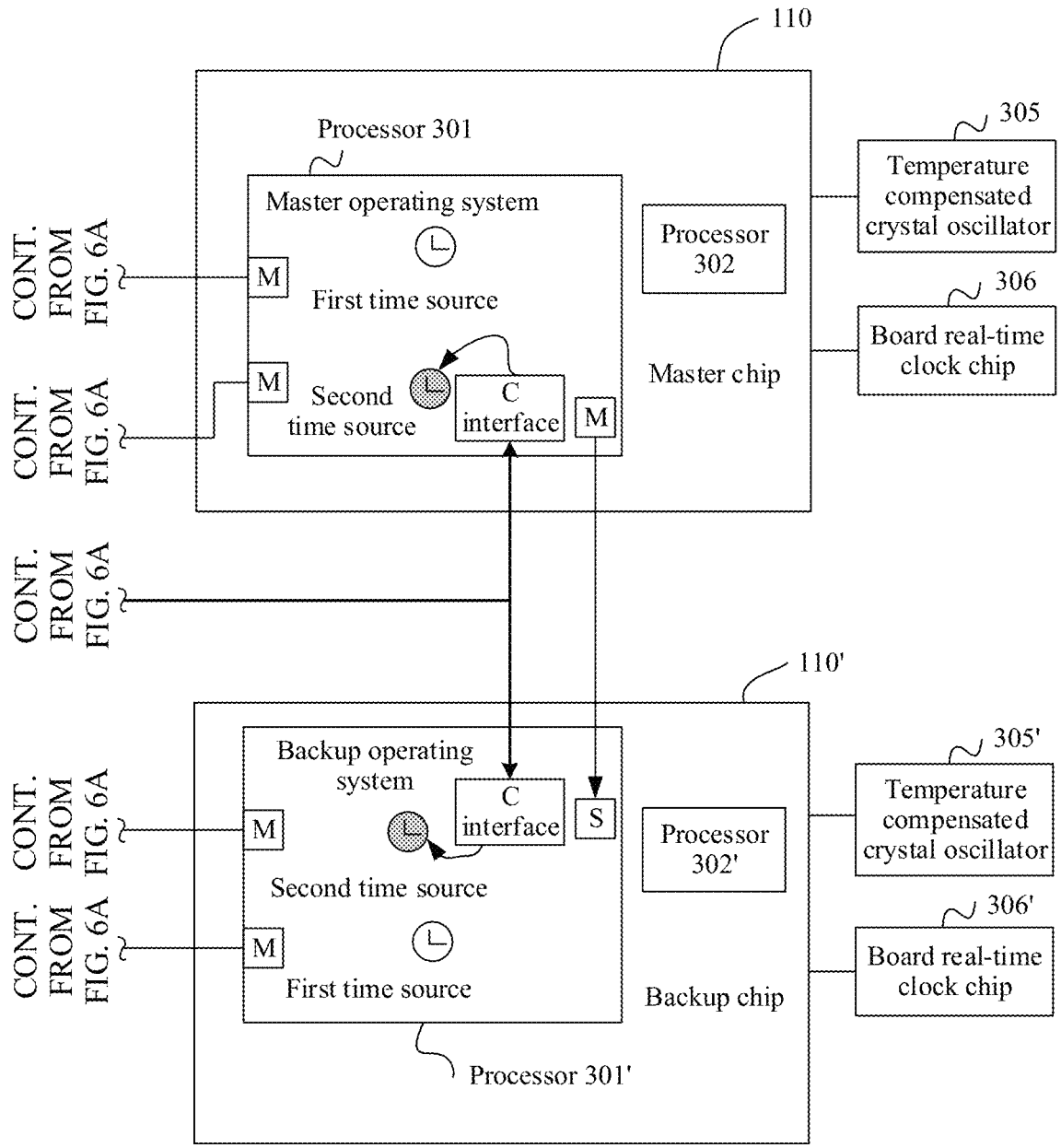

In some embodiments, the OS-CLK of the backup OS in the backup SoC is further used to trace the OS-CLK of a master OS in the master SoC. FIG. 6A and FIG. 6B are a schematic diagram of another principle of providing a time source for autonomous driving according to an embodiment of the present disclosure. As shown in FIG. 6A and FIG. 6B, both the processor 302 and the processor 302' run a same AO OS. An operating principle of the GNSS-CLK of the backup SoC is the same as that of the GNSS-CLK of the master SoC, and the master SoC and the backup SoC are connected to a same signal receiving module (that is, the GNSS module 308). The master SoC and the backup SoC are connected to different temperature compensated crystal oscillators. However, the OS-CLK of the backup SoC is based on time of the OS-CLK of the master SoC (namely, a master chip). Therefore, when the master SoC operates normally, the backup SoC (namely, a backup chip) can be used as a secondary master clock of the OS-CLK of the master SoC to provide a time reference for another end point. That is, a network interface or port of the OS-CLK of the master SoC for connecting to a point is expanded. For example, a LAN switch 1 (LSW 1) shown in FIG. 6A and FIG. 6B receives both a time synchronization message from the master SoC and a time synchronization message from the backup SoC. When the master SoC operates normally, a difference between time provided by the backup SoC and the master SoC is within an acceptable range and has little impact on a driving service (for example, on accuracy of a timestamp of data collected by a sensor). The LSW 1 can select the time synchronization message sent by the master SoC. Each LSW is connected to corresponding network interfaces of the master SoC and the backup SoC. As shown in FIG. 6A and FIG. 6B, a LAN switch 0/LAN switch 1 functions as an internal switching node, runs a gPTP protocol stack inside, functions as an 802.1AS boundary clock, receives and processes a gPTP packet sent by a master port on a master plane through one of ports, calculates an offset (a time offset and a frequency offset) between a local clock and a master clock and a path delay based on a protocol algorithm, adjusts the local clock and the master clock to implement synchronization of 10 us-level precision (this step is optional, and is similar to forwarding, by a transparent clock of 1588, a gPTP event message after only residence time of the gPTP event message is corrected), and becomes a secondary master clock in a current synchronization network. Then, time synchronization messages such as Anounce and Sync packets may be continuously sent, through the master clock port of the device, to an end point (End Point) whose time needs to be synchronized, for example, a sensor point, for example, a vehicle-mounted radar or a millimeter-wave radar. A sensor used as an end point runs gPTP protocol stack software to receive and process Anounce and Sync packets, calculates and adjusts an offset between the local clock and a GMC clock and a path transmission delay based on timestamp information carried in the packets, adjusts time of the local clock to maintain synchronization with GMC time. Through such a clock transfer layer, time offsets between all destination end points and the GMC time are controlled within a set range, for example, within 10 us.

It should be noted that the content shown in FIG. 6A and FIG. 6B is an extension of the content shown in FIG. 5, and corresponding content such as the processor 303, the processor 304, and the processor 302 that are not involved in FIG. 6A and FIG. 6B is not described herein.

Figure 7:
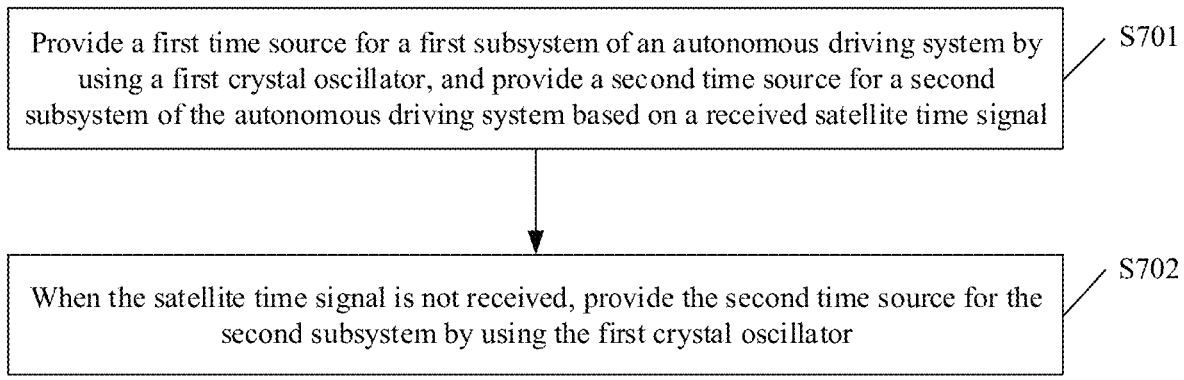
FIG. 7 is a schematic flowchart of a method for providing a time source for autonomous driving according to an embodiment of the present disclosure.

With reference to the foregoing hardware structure, the principle of providing a time source for autonomous driving, and the like, a method for providing a time source for autonomous driving according to an embodiment of the present disclosure is described below. FIG. 7 is a schematic flowchart of the method for providing a time source for autonomous driving according to an embodiment of the present disclosure. As shown in FIG. 7, the method is performed by the processor 301 (namely, a first processor), and may include step S701 and step S702.

Step S701: Provide a first time source for a first subsystem of an autonomous driving system by using a first crystal oscillator, and provide a second time source for a second subsystem of the autonomous driving system based on a received satellite time signal.

Figure 8:
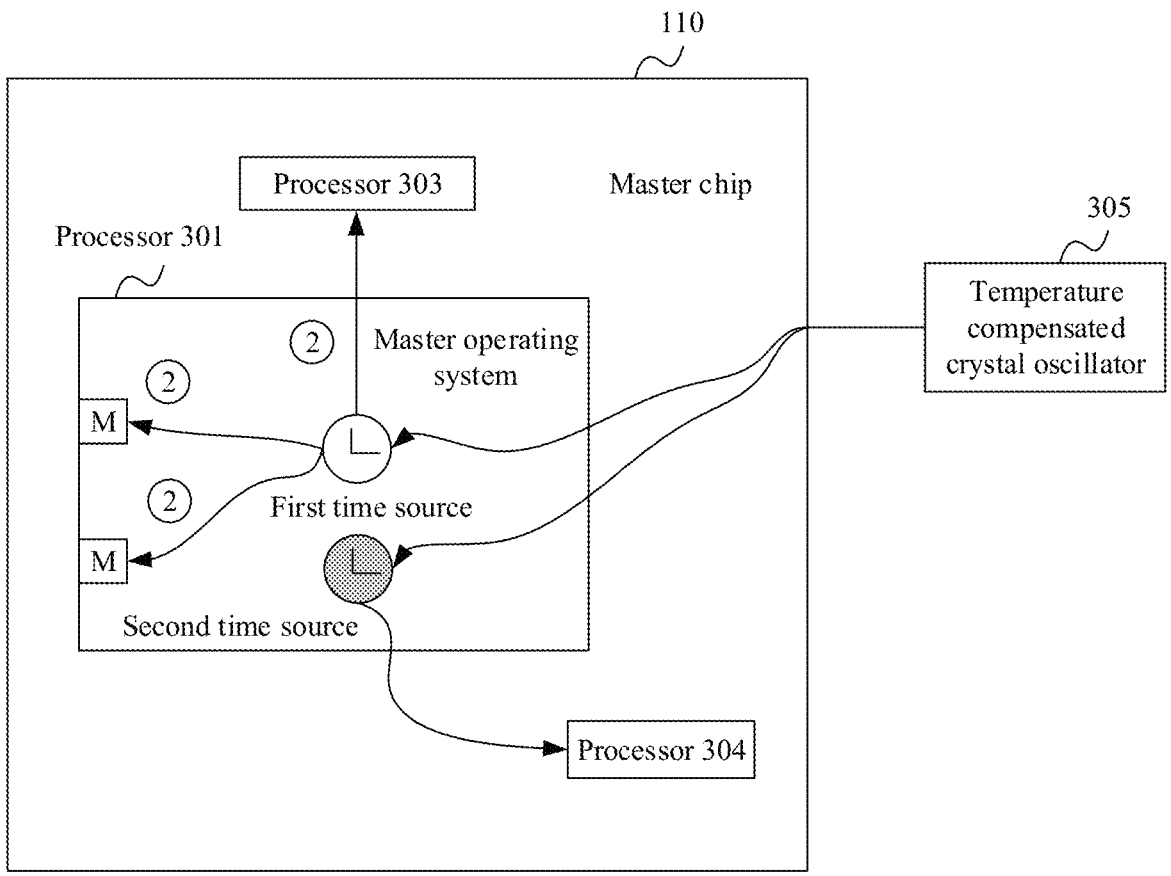
FIG. 8 is a schematic diagram of generating a time source according to an embodiment of the present disclosure.

In some embodiments, the first subsystem is configured to process driving service-related data of a vehicle, and the second subsystem is configured to process management-related data of the vehicle. FIG. 8 is a schematic diagram of generating a time source according to an embodiment of the present disclosure. As shown in FIG. 8, after a system is started, and a GNSS module can receive a GNSS signal (that is, a satellite time signal), to ensure security of autonomous driving, the first time source (that is, an OS-CLK) operates completely relying on a board temperature compensated crystal oscillator (for example, precision of the board temperature compensated crystal oscillator is 10 ppm). A hardware clock in an M network interface is adjusted to same time as that of the OS-CLK. Then, a master port (namely, the M network interface) sends Anounce and Sync packets (namely, time synchronization messages) at a frequency required by a gPTP protocol, so that the OS-CLK becomes a master clock of an entire network. When the GNSS signal is available, a reference frequency is provided for the second time source (that is, a GNSS-CLK) based on the GNSS signal, and the GNSS-CLK is adjusted to ensure synchronization with a GNSS time source (that is, GNSS time of a satellite). After synchronization, a difference between the GNSS-CLK and the GNSS time source is within 10 us. The OS-CLK is dedicated to a computing service (that is, a service of the first subsystem) for autonomous driving, operates only relying on a board crystal oscillator after bootup, and serves as a root clock (or referred to as a master clock) in a time synchronization network in the system to provide a global time source for another node on an autonomous driving plane. The GNSS-CLK is used for a vehicle management-related service (that is, a service of the second subsystem). It may be understood that service planes in the vehicle include a driving plane and a management plane. The driving plane is used for processing data related to vehicle driving calculation, and the management plane is used for processing data related to audit, log recording, and travel data management, Both the driving plane and the management plane may be considered to include or correspond to one or more subsystems, such as a travel system, a sensor system, and a control system.

In some embodiments, the GNSS signal (including a time position) is directly accessed to the system through a CAN bus and a PPS clock signal cable. In addition, both a master SoC and a backup SoC can receive the GNSS signal. Receiving the GNSS signal in this manner ensures that a GNSS-CLK of the master SoC and a GNSS-CLK of the backup SoC can effectively receive the GNSS signal, ensures consistency of signal transmission, and further ensures stability of a subsequent time source.

In a possible implementation, providing the second time source for the second subsystem of the autonomous driving system based on the received satellite time signal includes: generating the second time source by using the satellite time signal as a reference frequency of the second time source, where the satellite time signal is received by using a signal receiving module; and providing the second time source for the second subsystem.

Step S702: When the satellite time signal is not received, provide the second time source for the second subsystem by using the first crystal oscillator.

Figure 9:
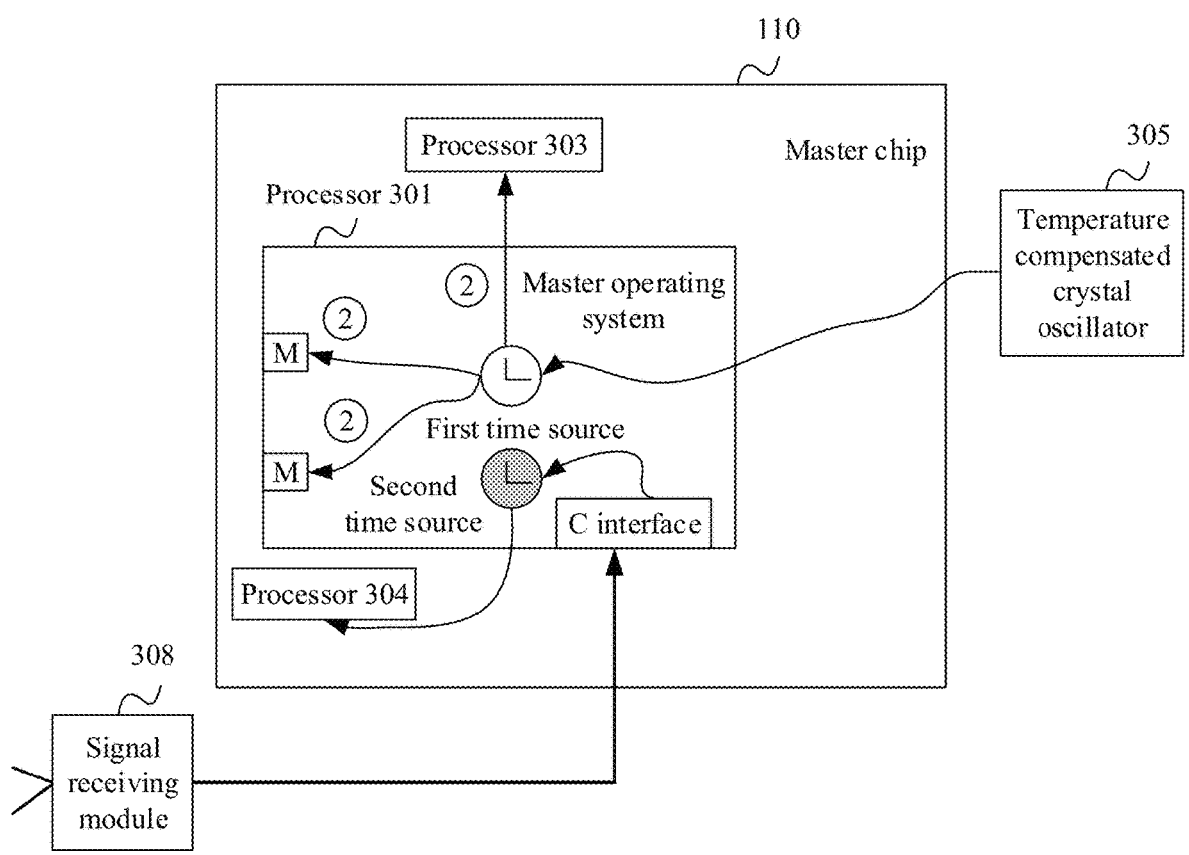
FIG. 9 is another schematic diagram of generating a time source according to an embodiment of the present disclosure.

In some embodiments, FIG. 9 is another schematic diagram of generating a time source according to an embodiment of the present disclosure. As shown in FIG. 9, when a GNSS module cannot trace a satellite (that is, cannot receive a GNSS signal), the GNSS module also outputs time, but the time may drift slowly. After receiving a feedback from the GNSS module, a GNSS-CLK generally does not continue to trace the time output by the GNSS module, but maintains a normal timing service of system time relying on the first crystal oscillator. An OS-CLK (that is, the first time source) still maintains normal operating of the system time relying on the first crystal oscillator. A UTC time service is provided. The OS-CLK clock traces GNSS time and provides UCT time for services on a management plane. In some embodiments, the GNSS-CLK may be a hardware clock of a network interface that does not need to participate in time synchronization or may be implemented through software. The GNSS-CLK is implemented after the vehicle is cold started or woken up from a sleep state and after initial bootup time is provided by the AO OS. When the GNSS is available, a GNSS time source is traced. When the GNSS is unavailable, the GNSS-CLK is time-synchronized by using a crystal oscillator of the GNSS-CLK, to meet a UTC time requirement of a management plane service. Certainly, time jumping may occur when the GNSS time is traced, but does not affect security of autonomous driving, and an impact on time accuracy of management plane data is insignificant.

In a possible implementation, the GNSS-CLK clock needs to in some embodiments encapsulate a user-mode API and a kernel-mode API for a module that requires accurate UTC time. The user-mode API is provided for a user and is used to perform operation and adjustment on time information in a management subsystem in a normal case. The kernel-mode API is provided for the user and is used to perform manual operation and adjustment on the system time when necessary. The operation and adjustment have great impact on the system. Generally, the user needs to obtain permission to perform operation on the system time through the kernel-mode API. It may be understood that, operations such as time synchronization are operations performed at a kernel level. When the user wants to obtain time (for example, a date of maintenance and test logs) in the management subsystem, the user can obtain only processed time information through only the user-mode interface, and cannot obtain underlying time of the system through only the user-mode interface. The user obtains the underlying time of the system through the kernel-mode interface.

Figure 10:
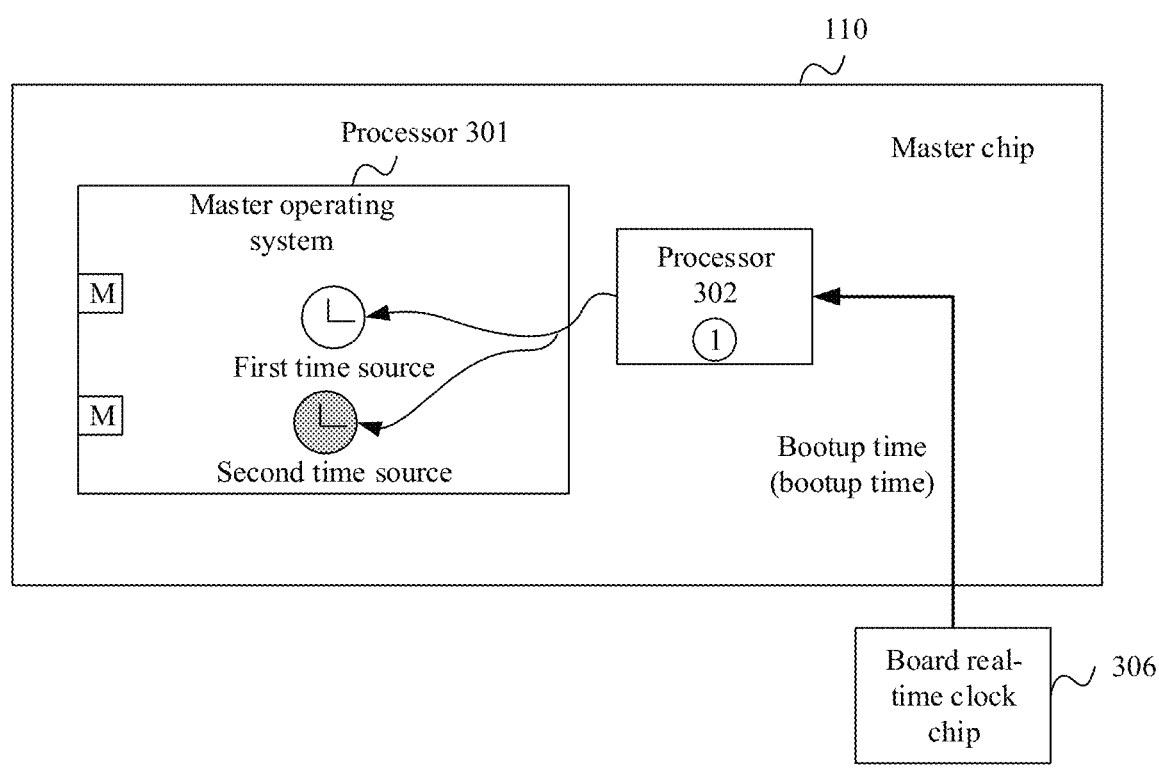
FIG. 10 is a schematic diagram of setting bootup time according to an embodiment of the present disclosure.

In a possible implementation, bootup time is obtained from a first clock module, where the bootup time is bootup time of the first time source and the second time source. FIG. 10 is a schematic diagram of setting bootup time according to an embodiment of the present disclosure. As shown in 1 in FIG. 10, an AO OS (that is, an operating system run by the processor 302) obtains the bootup time or a bootup time point (for example, 13:40) from the board real-time clock chip (that is, the board RTC, board RTC) 306. The bootup time is set as bootup time of the master OS (that is, the processor 301). In some embodiments, the bootup time is set as bootup time of an OS-CLK and a GNSS-CLK. For example, when the system is started or woken up from a sleep state, the AO OS obtains the bootup time from a real-time clock of the board RTC to set bootup time of an OS-CLK and a GNSS-CLK on a master plane.

Figure 11:
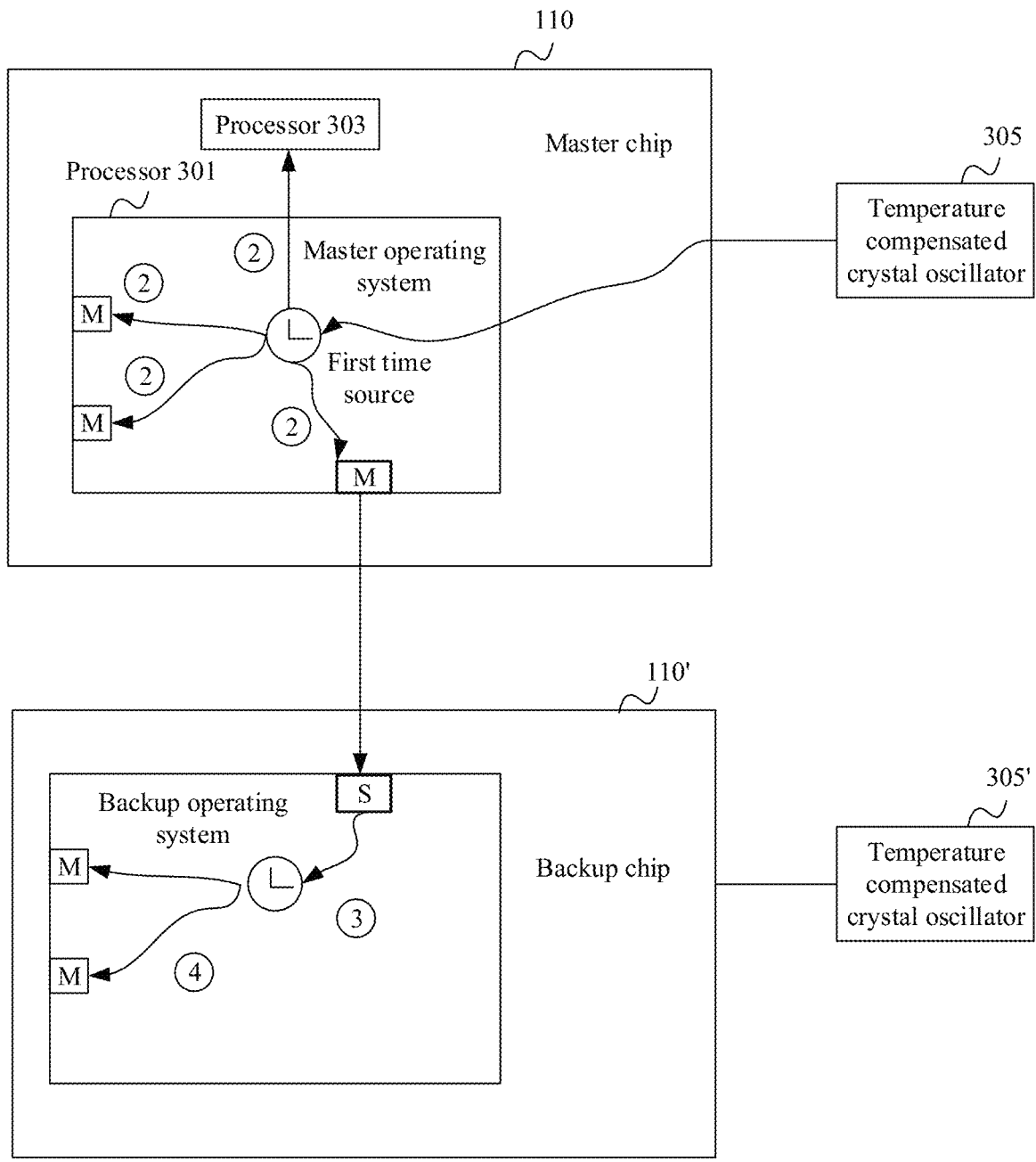
FIG. 11 is a schematic diagram of a master/backup SoC connection according to an embodiment of the present disclosure.

In a possible implementation, the master SoC and the backup SoC are directly connected through a network interface, and the OS-CLK of the backup SoC traces the OS-CLK on the master plane according to a TSN protocol. FIG. 11 is a schematic diagram of a master/backup SoC connection according to an embodiment of the present disclosure. As shown in ② in FIG. 11, the master SoC is connected to the temperature compensated crystal oscillator 305, and the temperature compensated crystal oscillator 305 provides a reference oscillation frequency for an OS-CLK. The OS-CLK is used as a master clock in a corresponding clock system, and provides time references for the processor 303 (configured to process an autonomous driving-related service), a plurality of M network interfaces (used to send a time synchronization message to an end point), and the backup SoC 110'. As shown in ③ and ④ in FIG. 11, the master SoC and the backup SoC are connected to different temperature compensated crystal oscillators. However, an error can be corrected through connection between the M network port and the S network port. Although the backup SoC relies on different temperature compensated crystal oscillators, when the master SoC operates normally, the OS-CLK of the master SoC is still traced to be used as the time reference. A master port clock is a clock role specified in the gPTP protocol. Only the master port clock can send a time synchronization message externally and has higher clock accuracy. A slave port clock is a clock role specified in the gPTP protocol. The slave port clock cannot send a time synchronization message externally, only receives and processes a synchronization message sent by an upper-level master clock, and needs to be adjusted to synchronize with the master clock. In this embodiment of the present disclosure, the master SoC and the backup SoC constitute a pair of master and slave port clocks. It may be understood that the master SoC and another boundary clock or a lower-level point also constitute a pair of master and slave port clocks.

Figure 12:
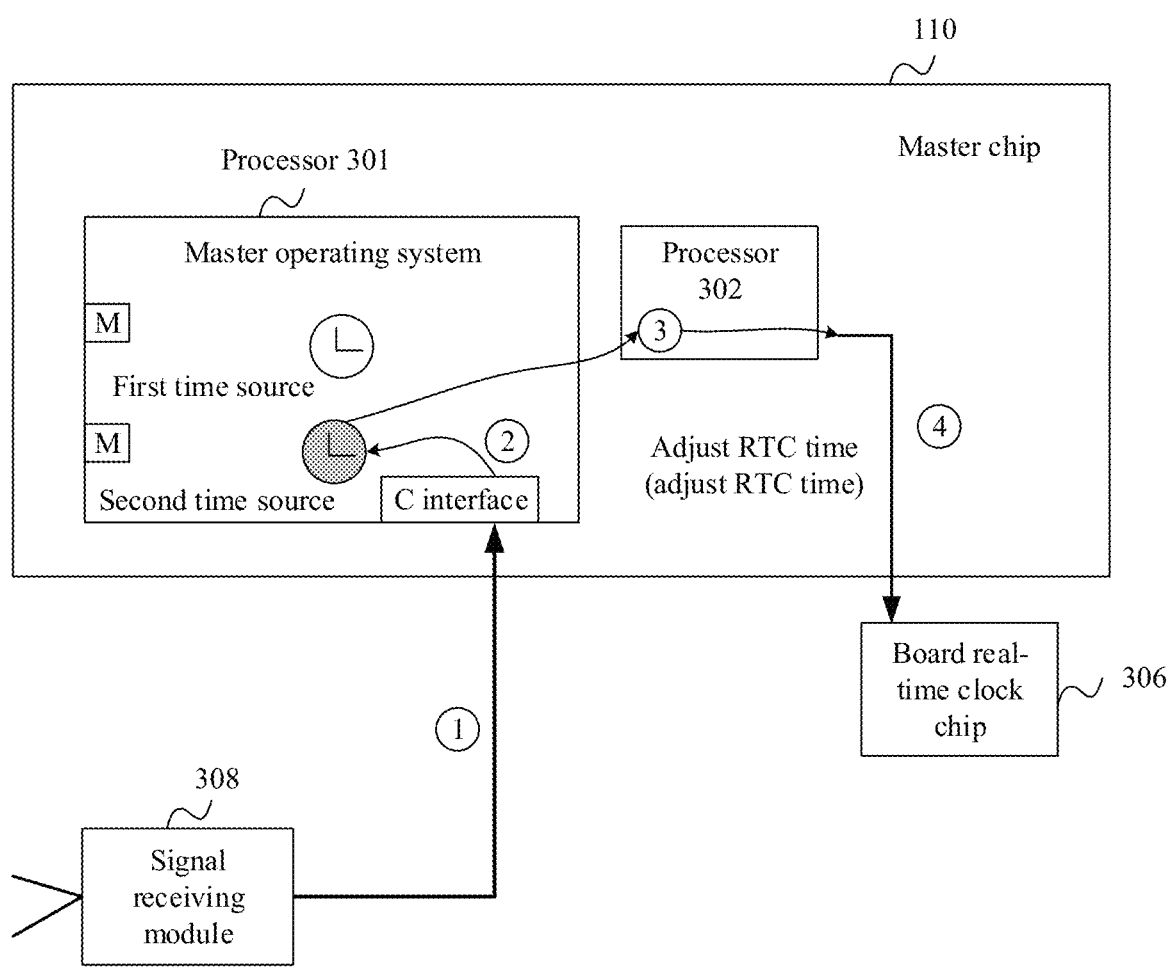
FIG. 12 is a schematic flowchart of adjusting a time source according to an embodiment of the present disclosure.

In a possible implementation, the method further includes: synchronizing a third time source based on the second time source and a preset adjustment periodicity, where the third time source is a time source provided by a first clock module. FIG. 12 is a schematic flowchart of adjusting a time source according to an embodiment of the present disclosure. As shown in ① to ④ in FIG. 12, first, in an adjustment periodicity, current GNSS time fed back by the GNSS module is received through a GNSS interface. The GNSS-CLK traces a GNSS signal. RTC time is synchronized with the GNSS time of the GNSS-CLK through the AO OS.

For example, initial bootup time of a clock OS-CLK related to autonomous driving calculation is provided by the AO OS after the vehicle is cold started or woken from a sleep state. Then, the OS clock operates completely relying on a crystal oscillator of the OS clock, and no longer traces the GNSS time source. Another point on the board traces, based on the gPTP protocol, the OS-CLK to implement network-wide clock synchronization. In this case, due to drift of the crystal oscillator of the OS clock, the OS-CLK gradually offsets, and a clock of another node also offsets. Therefore, during autonomous driving, the GNSS-CLK is used to periodically adjust an RTC clock to keep the RTC clock synchronized with the GNSS clock. In this way, a difference between time of the autonomous driving system and UTC time is not large, and this effectively prevents infinite drift of time of the OS-CLK.

In the foregoing embodiment of the present disclosure, three sets of clocks with independent crystal oscillators are deployed on the board: OS-CLK, GNSS-CLK, and RTC-CLK. The OS-CLK of an autonomous driving plane mainly operates relying on self-oscillation of a board temperature compensated crystal oscillator. To prevent the temperature compensated crystal oscillator from abnormality or failure, health monitoring needs to be performed on an operating status of the temperature compensated crystal oscillator. A timing (for example, 50) ms) monitoring program is designed to prevent time jumping of a root clock due to the abnormality of the crystal oscillator from affecting security of autonomous driving. Therefore, the OS-CLK is monitored and adjusted based on a monitoring algorithm provided in this embodiment of the present disclosure.

The algorithm is described as follows:
determining frequency ratios of three time sources, where the frequency ratios of the three time sources include a first frequency ratio of the first time source to the second time source, a second frequency ratio of the first time source to the third time source, and a third frequency ratio of the second time source to the third time source;

determining a frequency ratio difference of any two of the three time sources based on the frequency ratios of the three time sources and a historical frequency ratio corresponding to any two of the three time sources, where the frequency ratio differences of the three time sources include a first frequency ratio difference between the first frequency ratio and a historical first frequency ratio, a second frequency ratio difference between the second frequency ratio and a historical second frequency ratio, and a third frequency ratio difference between the third frequency ratio and a historical third frequency ratio; and determining, based on the first frequency ratio difference, the second frequency ratio difference, and the third frequency ratio difference, that a frequency of a crystal oscillator corresponding to a target time source in the first time source, the second time source, or the third time source offsets from a preset frequency range.

In a possible implementation, the determining frequency ratios of three time sources includes:
determine the first frequency ratio FR1, the second frequency ratio FR2, and the third frequency ratio FR3 according to the following formulas:

$$FR1 = \frac{OS\_CLK_{Frequency}}{GNSS\_CLK_{Frequency}}$$

$$FR2 = \frac{OS\_CLK_{Frequency}}{RTC\_CLK_{Frequency}}$$

$$FR3 = \frac{GNSS\_CLK_{Frequency}}{RTC\_CLK_{Frequency}}.$$

$OS\_CLK_{Frequency}$ is a clock frequency of the first time source, $GNSS\_CLK_{Frequency}$ is a clock frequency of the second time source, and $RTC\_CLK_{Frequency}$ is a clock frequency of the third time source.

In some embodiments, in an operating process, a frequency of each physical clock actually jitters. Therefore, a frequency ratio of the two clocks also jitters. According to a method recommended in an 802.1-AS Protocol, timestamp sequences of two clocks can be measured periodically and continuously. A size of the timestamp sequence is fixed. For example, 7 to 10 timestamps are stored in the timestamp sequence of each clock. The timestamp sequence may be implemented through a queue. After the queue is full, each time a new timestamp enters the queue, an oldest timestamp at the tail of the queue is eliminated. Then, a ratio of differences obtained by subtracting first and last timestamps of the timestamp sequences of the two clocks is:

$$\frac{CLK1_{TN} - CLK1_{T0}}{CLK0_{TN} - CLK0_{T0}}.$$

For example, TN may be a seventh timestamp, and T0 may be the first timestamp. The difference is a time period between the first timestamp and the seventh timestamp.

A reciprocal ratio of the differences is used as a frequency ratio of the two clocks:

$$FR = \frac{CLK0_{FrequeNcy}}{CLK1_{FrequeNcy}}.$$

In a possible implementation, the determining a frequency ratio difference of any two of the three time sources based on the frequency ratios of the three time sources and a historical frequency ratio corresponding to any two of the three time sources includes:

determining the first frequency ratio difference ΔFR1, the second frequency ratio difference ΔFR2, and the third frequency ratio difference ΔFR3 according to the following formulas:

$$\Delta FR1 = abs(FR1 - FR1_{AVG})$$

$$\Delta FR2 = abs(FR2 - FR2_{AVG})$$

$$\Delta FR3 = abs(FR3 - FR3_{AVG}).$$

abs(FR1−FR1$_{AVG}$) is an absolute value of a difference between the first frequency ratio and the historical first frequency ratio, abs(FR2−FR2$_{AVG}$) is an absolute value of a difference between the second frequency ratio and the historical second frequency ratio, and abs(FR3−FR3$_{AVG}$) is an absolute value of a difference between the third frequency ratio and the historical third frequency ratio.

For example, a currently and recently measured frequency ratio of the two CLKs may be marked as FR_Curr (that is, FR1 in the foregoing formula), and ΔFR is defined as a difference between the current frequency ratio and a historical average frequency ratio. In normal cases, ΔFR changes within a proper value range that can be expected, and a probability that frequencies of the three groups of clocks hop or fail at the same time can be infinitely low. Therefore, it can be inferred that if an ΔFR suddenly becomes larger than a preset threshold, one of the two clocks may be faulty. The specific one can be found through three comparisons, for example, comparing any two of the frequency ratio change ΔFR1 between the OS-CLK and the GNSS-CLK, the frequency ratio change ΔFR2 between the OS-CLK and the RTC-CLK, and the frequency ratio change ΔFR3 between the GNSS-CLK and the RTC-CLK.

In some embodiments, because the probability that the frequencies of the three groups of clocks hop or fail at the same time is infinitely low, a clock whose crystal oscillator is abnormal is determined based on a voting principle. If ΔFR1 and ΔFR2 suddenly becomes larger than the threshold, but ΔFR3 is within the normal range, it is determined that a frequency of the crystal oscillator of the OS-CLK clock is abnormal.

In some embodiments, once it is detected that the frequency of the crystal oscillator of the clock is abnormal, a clock exception alarm needs to be reported to an upper-layer management plane.

It is mentioned above that an average value of the frequency ratios needs to be calculated. The following provides a method for calculating the historical frequency average value, and the method further includes:

determining a k$^{th}$ first frequency ratio, a k$^{th}$ second frequency ratio, and a k$^{th}$ third frequency ratio based on a preset measurement periodicity, until N first frequency ratios, N second frequency ratios, and N third frequency ratios are determined, where 0<k≤N, and k is an integer; and determining, based on the N first frequency ratios, the N second frequency ratios, and the N third frequency ratios, historical frequency ratios corresponding to the three groups of frequency ratios, where the historical frequency ratios corresponding to the three groups of frequency ratios include the historical first frequency ratio corresponding to the first frequency ratio, the historical second frequency ratio corresponding to the second frequency ratio, and the historical third frequency ratio corresponding to the third frequency ratio.

In a possible implementation, the determining, based on the N first frequency ratios, the N second frequency ratios, and the N third frequency ratios, historical frequency ratios corresponding to the three groups of frequency ratios includes:

determining the historical first frequency ratio FR1$_{AVG}$, the historical second frequency ratio FR1$_{AVG}$, and the historical third frequency ratio FR3$_{AVG}$ according to the following formulas:

$$FR1_{AVG} = \frac{fr1_1 + fr1_2 + fr1_3 + \ldots + fr1_N}{N}$$

$$FR2_{AVG} = \frac{fr2_1 + fr2_2 + fr2_3 + \ldots + fr2_N}{N}$$

$$FR3_{AVG} = \frac{fr3_1 + fr3_2 + fr3_3 + \ldots + fr3_N}{N}.$$

$fr1_1$, $fr1_2$, $fr1_3$, ..., and $fr1_N$ are respectively a $1^{st}$ first frequency ratio, a $2^{nd}$ first frequency ratio, a $3^{rd}$ first frequency ratio, ..., and an N$^{th}$ first frequency ratio, $fr2_1$, $fr2_2$, $fr2_3$, ..., and $fr2_N$ are respectively a $1^{st}$ second frequency ratio, a $2^{nd}$ second frequency ratio, a $3^{rd}$ second frequency ratio, ..., and an N$^{th}$ second frequency ratio, and $fr3_1$, $fr3_2$, $fr3_3$, ..., and $fr3_N$ are respectively a $1^{st}$ third frequency ratio, a $2^{nd}$ third frequency ratio, a $3^{rd}$ third frequency ratio, ..., and an N$^{th}$ third frequency ratio.

N may represent the latest sample quantity of frequency ratios, and may have a value between 7 and 10.

In some embodiments, the foregoing crystal oscillator failure detection method is implemented by software, and the software needs to collect, process, and calculate a large amount of data, and also relies on a scheduling policy of the OS. Consequently, a detection result may not be timely. The method may be implemented by a dedicated hardware logic circuit. Alternatively, hardware detection logic is written into a board CPLD component to implement quicker and more accurate crystal oscillator failure detection.

Figure 13:
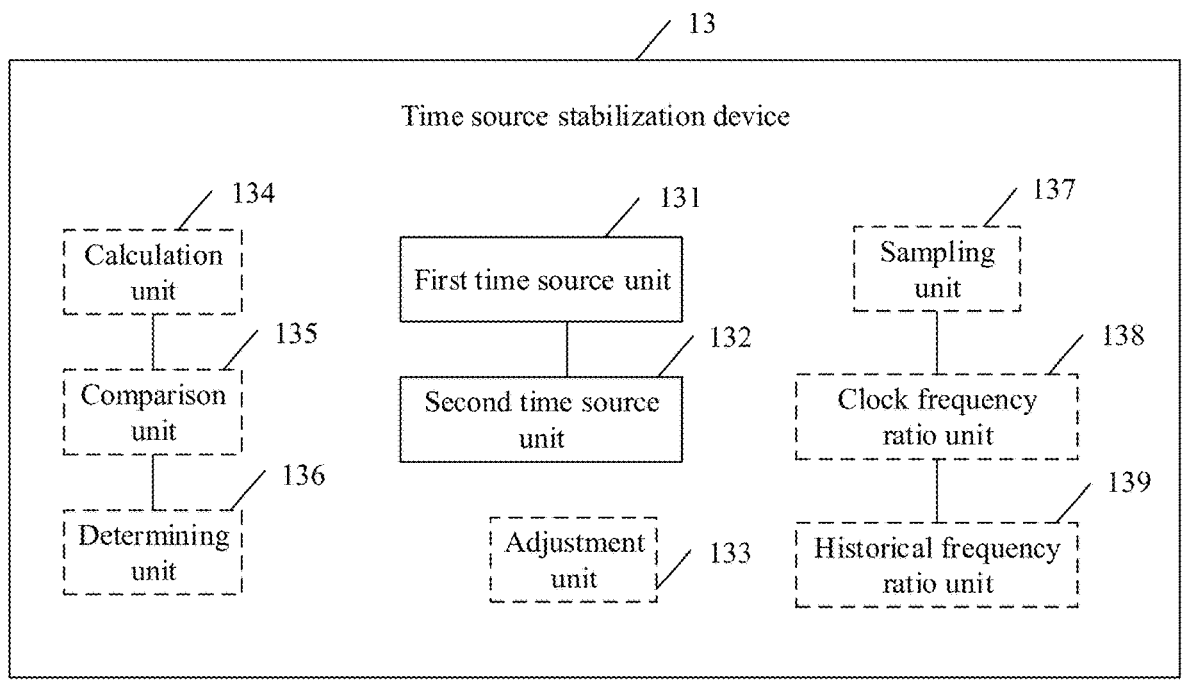
FIG. 13 is a schematic diagram of a structure of an apparatus for providing a time source for autonomous driving according to an embodiment of the present disclosure.

The methods in embodiments of the present disclosure are described in detail above, and a relative virtual apparatus in embodiments of the present disclosure are provided below:

FIG. 13 is a schematic diagram of a structure of an apparatus for providing a time source for autonomous driving according to an embodiment of the present disclosure. The apparatus 131 for providing a time source for autonomous driving includes a first time source unit 131, a second time source unit 132, an adjustment unit 133, a calculation unit 134, a comparison unit 135, a determining unit 136, a measurement unit 137, and a historical frequency ratio unit 138.

The first time source unit 131 is configured to provide a first time source for a first subsystem of an autonomous driving system by using a first crystal oscillator, and provide a second time source for a second subsystem of the autonomous driving system based on a received satellite time signal.

In a possible implementation, the apparatus further includes the second time source unit 132, configured to:
when the satellite time signal is not received, provide the second time source for the second subsystem by using the first crystal oscillator.

In a possible implementation, the first time source unit 131 is In some embodiments configured to:
generate the second time source by using the satellite time signal as a reference frequency of the second time source, where the satellite time signal is received by using a signal receiving module; and
provide the second time source for the second subsystem.

In a possible implementation, the apparatus further includes the adjustment unit 133, configured to:
synchronize a third time source based on the second time source and a preset adjustment periodicity, where the third time source is a time source provided by a first clock module.

In a possible implementation, the apparatus further includes:
the calculation unit 134, configured to determine frequency ratios of three time sources, where the frequency ratios of the three time sources include a first frequency ratio of the first time source to the second time source, a second frequency ratio of the first time source to the third time source, and a third frequency ratio of the second time source to the third time source;
the comparison unit 135, configured to determine a frequency ratio difference of any two of the three time sources based on the frequency ratios of the three time sources and a historical frequency ratio corresponding to any two of the three time sources, where the frequency ratio differences of the three time sources include a first frequency ratio difference between the first frequency ratio and a historical first frequency ratio, a second frequency ratio difference between the second frequency ratio and a historical second frequency ratio, and a third frequency ratio difference between the third frequency ratio and a historical third frequency ratio; and
the determining unit 136, configured to determine, based on the first frequency ratio difference, the second frequency ratio difference, and the third frequency ratio difference, that a frequency of a crystal oscillator corresponding to a target time source in the first time source, the second time source, or the third time source offsets from a preset frequency range.

In a possible implementation, the calculation unit 134 is In some embodiments configured to:
determine the first frequency ratio FR1, the second frequency ratio FR2, and the third frequency ratio FR3 according to the following formulas:

$$FR1 = \frac{OS\_CLK_{Frequency}}{GNSS\_CLK_{Frequency}}$$

$$FR2 = \frac{OS\_CLK_{Frequency}}{RTC\_CLK_{Frequency}}$$

$$FR3 = \frac{GNSS\_CLK_{Frequency}}{RTC\_CLK_{Frequency}}.$$

$OS\_CLK_{Frequency}$ is a clock frequency of the first time source, $GNSS\_CLK_{Frequency}$ is a clock frequency of the second time source, and $RTC\_CLK_{Frequency}$ is a clock frequency of the third time source.

In a possible implementation, the comparison unit 135 is In some embodiments configured to:
determine the first frequency ratio difference $\Delta FR1$, the second frequency ratio difference $\Delta FR2$, and the third frequency ratio difference $\Delta FR3$ according to the following formulas:

$$\Delta FR1 = \text{abs}(FR1 - FR1_{AVG})$$

$$\Delta FR2 = \text{abs}(FR2 - FR2_{AVG})$$

$$\Delta FR3 = \text{abs}(FR3 - FR3_{AVG}).$$

$\text{abs}(FR1-FR1_{AVG})$ is an absolute value of a difference between the first frequency ratio and the historical first frequency ratio, $\text{abs}(FR2-FR2_{AVG})$ is an absolute value of a difference between the second frequency ratio and the historical second frequency ratio, and $\text{abs}(FR3-FR3_{AVG})$ is an absolute value of a difference between the third frequency ratio and the historical third frequency ratio.

In a possible implementation, the apparatus further includes:
the measurement unit 137, configured to determine a $k^{th}$ first frequency ratio, a $k^{th}$ second frequency ratio, and a $k^{th}$ third frequency ratio based on a preset measurement periodicity, until N first frequency ratios, N second frequency ratios, and N third frequency ratios are determined, where $0<k\leq N$, and k is an integer; and
the historical frequency ratio unit 138, configured to determine, based on the N first frequency ratios, the N second frequency ratios, and the N third frequency ratios, historical frequency ratios corresponding to the three groups of frequency ratios, where the historical frequency ratios corresponding to the three groups of frequency ratios include the historical first frequency ratio corresponding to the first frequency ratio, the historical second frequency ratio corresponding to the second frequency ratio, and the historical third frequency ratio corresponding to the third frequency ratio.

In a possible implementation, the historical frequency ratio unit 138 is in some embodiments configured to:
determine the historical first frequency ratio $FR1_{AVG}$, the historical second frequency ratio $FR1_{AVG}$, and the historical third frequency ratio $FR3_{AVG}$ according to the following formulas:

$$FR1_{AVG} = \frac{fr1_1 + fr1_2 + fr1_3 + \ldots + fr1_N}{N}$$

$$FR2_{AVG} = \frac{fr2_1 + fr2_2 + fr2_3 + \ldots + fr2_N}{N}$$

$$FR3_{AVG} = \frac{fr3_1 + fr3_2 + fr3_3 + \ldots + fr3_N}{N}.$$

$fr1_1$, $fr1_2$, $fr1_3$, ..., and $fr1_N$ are respectively a $1^{st}$ first frequency ratio, a $2^{nd}$ first frequency ratio, a $3^{rd}$ first frequency ratio, ..., and an $N^{th}$ first frequency ratio, $fr2_1$, $fr2_2$, $fr2_3$, ..., and $fr2_N$ are respectively a $1^{st}$ second frequency ratio, a $2^{nd}$ second frequency ratio, a $3^{rd}$ second frequency ratio, ..., and an $N^{th}$ second frequency ratio, and $fr3_1$, $fr3_2$, $fr3_3$, ..., and $fr3_N$ are respectively a $1^{st}$ third frequency ratio, a $2^{nd}$ third frequency ratio, a $3^{rd}$ third frequency ratio, ... and an $N^{th}$ third frequency ratio.

In a possible implementation, the first crystal oscillator is a temperature compensated crystal oscillator.

It should be noted that, for the apparatus for providing a time source for autonomous driving described in this embodiment of the present disclosure, refer to related descriptions of the method for providing a time source for autonomous driving in the method embodiment described in FIG. 7. Details are not described herein again.

Figure 14:
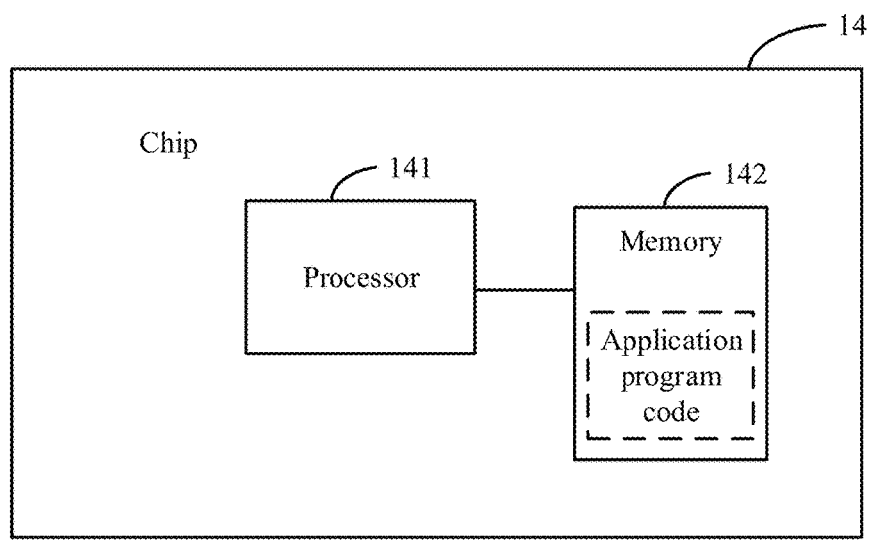
FIG. 14 is a schematic diagram of a structure of a chip according to an embodiment of the present disclosure.

FIG. 14 is a schematic diagram of a structure of a chip according to an embodiment of the present disclosure. An apparatus 13 for providing a time source for autonomous driving may be implemented by using the structure in FIG. 14. A device 14 includes at least one processor 141 and at least one memory 142. In addition, the device may further include general components such as an antenna, and details are not described herein.

The processor 141 may be a general-purpose central processing unit (CPU), a microprocessor, an application-specific integrated circuit (ASIC), or one or more integrated circuits for controlling program execution of the foregoing solution.

The memory 142 may be a read-only memory (read-only memory, ROM) or another type of static storage device that can store static information and instructions, a random access memory (random access memory, RAM) or another type of dynamic storage device that can store information and instructions, an electrically erasable programmable read-only memory (EEPROM), a compact disc read-only memory (CD-ROM) or another compact disc storage, optical disc storage (including a compressed optical disc, a laser disc, an optical disc, a digital versatile disc, a blue-ray optical disc, and the like), a magnetic disk storage medium or another magnetic storage communications device, or any other medium that can be configured to carry or store expected program code in a form of instructions or a data structure and that can be accessed by a computer. However, the memory 142 is not limited thereto. The memory may exist independently, and is connected to the processor by using the bus. Alternatively, the memory may be integrated into the processor.

The memory 142 is configured to store application code for executing the foregoing solutions, and the processor 141 controls the execution. The processor 141 is configured to execute the application code stored in the memory 142.

When the chip shown in FIG. 14 is the apparatus for providing a time source for autonomous driving, the code stored in the memory 142 may be used to execute the method for providing a time source for autonomous driving that is provided in FIG. 7. For example, when a satellite time signal is received, a first time source is provided for a first subsystem of an autonomous driving system by using a first crystal oscillator, and a second time source is provided for a second subsystem of the autonomous driving system based on the received satellite time signal.

It should be noted that, for a function of the chip 14 described in this embodiment of the present disclosure, refer to related descriptions in the method embodiment in FIG. 7. Details are not described herein again.

Figure 15:
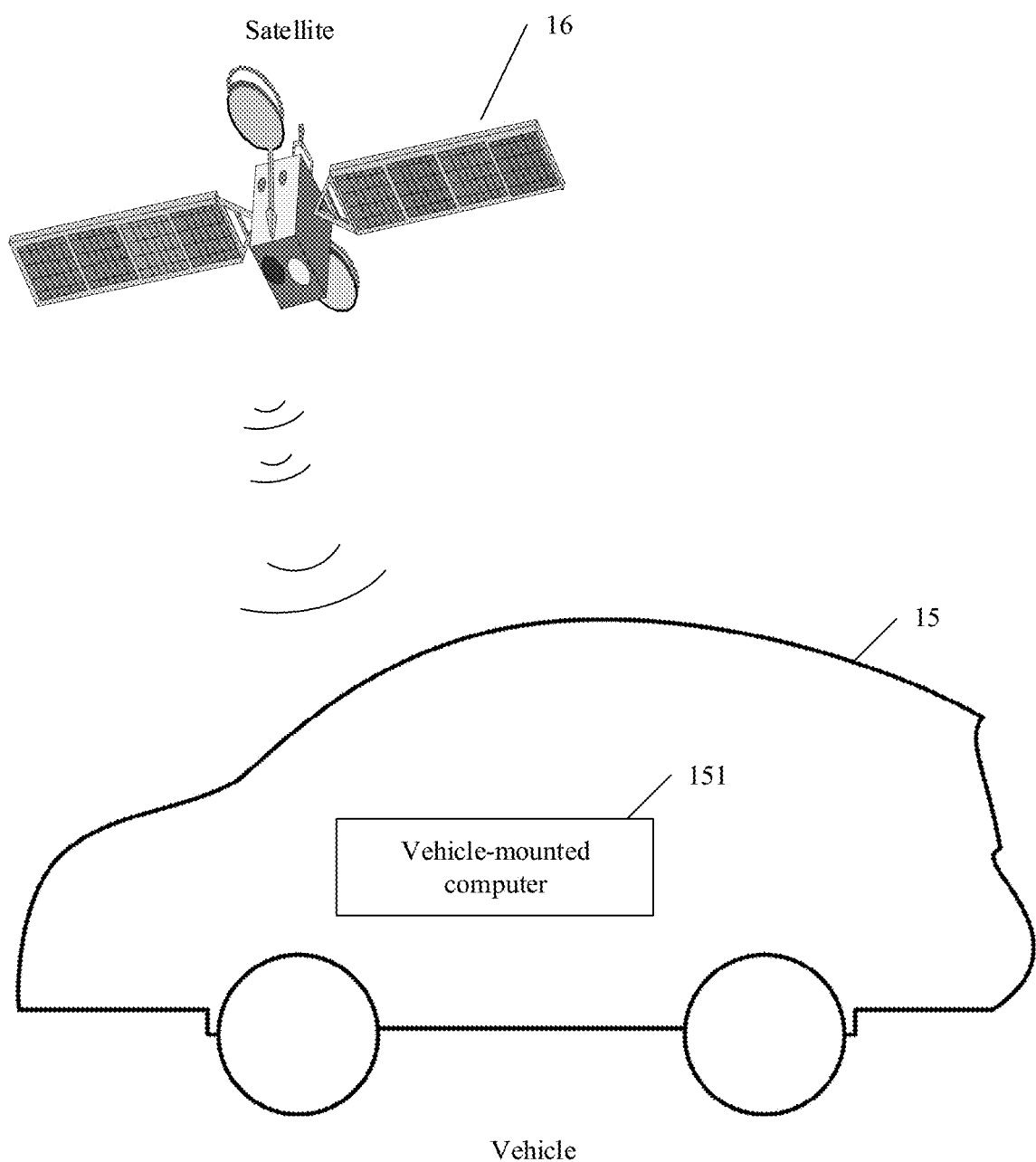
FIG. 15 is a schematic diagram of a vehicle according to an embodiment of the present disclosure.

An embodiment of the present disclosure further provides a vehicle equipped with an autonomous driving system. FIG. 15 is a schematic diagram of a vehicle according to an embodiment of the present disclosure. As shown in FIG. 15, the vehicle 15 includes a vehicle-mounted computer 151, and may receive a satellite time signal sent by a satellite 16. The vehicle-mounted computer may perform some or all of the steps recorded in any one of the method embodiments corresponding to FIG. 7 to FIG. 12. For example, when a satellite time signal is received, a first time source operating relying on a first crystal oscillator and a second time source operating relying on the satellite signal are provided. When no satellite time signal is received, the first time source that still operates relying on the first crystal oscillator and the second time source that operates switching to relying on the first crystal oscillator are provided. In some embodiments, the vehicle may further include a backup vehicle-mounted computer, to avoid a single point failure in the autonomous driving system, and improve overall system reliability.

In the foregoing embodiments, descriptions of embodiments have respective focuses. For a part that is not described in detail in an embodiment, refer to related descriptions in other embodiments.

It should be noted that, for brief description, the foregoing method embodiments are represented as a series of actions. However, persons skilled in the art should appreciate that this application is not limited to the described order of the actions, because according to this application, some steps may be performed in other orders or simultaneously. It should be further appreciated by persons skilled in the art that embodiments described in this specification all belong to preferred embodiments, and the involved actions and modules are not necessarily required in this application.

In several embodiments provided in this application, it should be understood that the disclosed apparatuses may be implemented in other manners. For example, the described apparatus embodiment is merely an example. For example, division into the units is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The foregoing units described as separate parts may or may not be physically separate, and parts displayed as units may or may not be physical units, may be located in one position, or may be distributed on a plurality of network units. Some or all of the units may be selected based on actual needs to achieve the objectives of the solutions of embodiments.

In addition, function units in embodiments of this application may be integrated into one processing unit, or each of the units may exist alone physically, or two or more units are integrated into one unit. The integrated unit may be implemented in a form of hardware, or may be implemented in a form of a software function unit.

Based on such an understanding, the technical solutions in this application essentially, or the part contributing to the prior art, or all or some of the technical solutions may be implemented in the form of a software product. The computer software product is stored in a storage medium and includes several instructions for instructing a computer device (which may be a personal computer, a server, or a network device, and may be in some embodiments a processor in a computer device) to perform all or some steps of the foregoing methods described in embodiments of this application. The foregoing storage medium may include any medium that can store program code, such as a USB flash drive, a removable hard disk, a magnetic disk, an optical disc, a read-only memory (ROM), or a random access memory (RAM).

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of embodiments of this application.

What is claimed is:

1. An apparatus for providing a time source for an autonomous driving system in a vehicle, and comprising a first processor and a first crystal oscillator connected to the first processor, wherein
the first processor is configured to provide a first time source for a first subsystem of the autonomous driving system by using the first crystal oscillator, and provide a second time source for a second subsystem of the autonomous driving system based on a received satellite time signal, the first subsystem is configured to process driving service-related data of the vehicle, and the second subsystem is configured to process management-related data of the vehicle.

2. The apparatus according to claim 1, wherein the first processor is further configured to:
when the satellite time signal is not received, provide the second time source for the second subsystem by using the first crystal oscillator.

3. The apparatus according to claim 2, wherein the apparatus further comprises a signal receiving module connected to the first processor; wherein the signal receiving module is configured to: when the satellite time signal is received, provide a reference frequency for the second time source based on the satellite time signal; and
the first processor is further configured to:
generate the second time source based on the reference frequency, and provide the second time source for the second subsystem.

4. The apparatus according to claim 3, wherein the apparatus further comprises a first clock module connected to the first processor; and
the first clock module is configured to synchronize a third time source based on the second time source and a preset adjustment periodicity, wherein the third time source is a time source provided by the first clock module.

5. The apparatus according to claim 4, wherein the first processor is further configured to:
determine frequency ratios of the first time source, the second time source and the third time source, wherein the frequency ratios of the first time source, the second time source and the third time source comprise a first frequency ratio of the first time source to the second time source, a second frequency ratio of the first time source to the third time source, and a third frequency ratio of the second time source to the third time source;
determine a frequency ratio difference of any two of the first time source, the second time source and the third time source based on the frequency ratios of the first time source, the second time source and the third time source and a historical frequency ratio corresponding to any two of the first time source, the second time source and the third time source, wherein the frequency ratio differences of the first time source, the second time source and the third time source comprise a first frequency ratio difference between the first frequency ratio and a historical first frequency ratio, a second frequency ratio difference between the second frequency ratio and a historical second frequency ratio, and a third frequency ratio difference between the third frequency ratio and a historical third frequency ratio; and
determine, based on the first frequency ratio difference, the second frequency ratio difference, and the third frequency ratio difference, that a frequency of a crystal oscillator corresponding to a target time source in the first time source, the second time source, or the third time source offsets from a preset frequency range.

6. The apparatus according to claim 5, wherein the first processor is configured to:
determine the first frequency ratio FR1, the second frequency ratio FR2, and the third frequency ratio FR3 according to the following formulas:

$$FR1 = \frac{OS\_CLK_{Frequency}}{GNSS\_CLK_{Frequency}}$$

$$FR2 = \frac{OS\_CLK_{Frequency}}{RTC\_CLK_{Frequency}}$$

$$FR3 = \frac{GNSS\_CLK_{Frequency}}{RTC\_CLK_{Frequency}},$$

wherein
$OS\_CLK_{Frequency}$ is a clock frequency of the first time source, $GNSS\_CLK_{Frequency}$ is a clock frequency of the second time source, and $RTC\_CLK_{Frequency}$ is a clock frequency of the third time source.

7. The apparatus according to claim 6, wherein the first processor is configured to:
determine the first frequency ratio difference $\Delta FR1$, the second frequency ratio difference $\Delta FR2$, and the third frequency ratio difference $\Delta FR3$ according to the following formulas:

$$\Delta FR1 = \text{abs}(FR1 - FR1_{AVG})$$

$$\Delta FR2 = \text{abs}(FR2 - FR2_{AVG})$$

$$\Delta FR3 = \text{abs}(FR3 - FR3_{AVG}),$$

wherein
abs(FR1−FR1$_{AVG}$) is an absolute value of a difference between the first frequency ratio and the historical first frequency ratio, abs (FR2−FR2$_{AVG}$) is an absolute value of a difference between the second frequency ratio and the historical second frequency ratio, and abs(FR3−FR3$_{AVG}$) is an absolute value of a difference between the third frequency ratio and the historical third frequency ratio.

8. The apparatus according to claim 7, wherein the first processor is further configured to:
determine a k$^{th}$ first frequency ratio, a k$^{th}$ second frequency ratio, and a k$^{th}$ third frequency ratio based on a preset measurement periodicity, until N first frequency ratios, N second frequency ratios, and N third frequency ratios are determined, wherein 0<k≤N, and k is an integer; and
determine, based on the N first frequency ratios, the N second frequency ratios, and the N third frequency ratios, historical frequency ratios corresponding to the three groups of frequency ratios, wherein the historical frequency ratios corresponding to the three groups of frequency ratios comprise the historical first frequency ratio corresponding to the first frequency ratio, the historical second frequency ratio corresponding to the second frequency ratio, and the historical third frequency ratio corresponding to the third frequency ratio.

9. The apparatus according to claim 8, wherein the first processor is configured to:
determine the historical first frequency ratio FR1$_{AVG}$, the historical second frequency ratio FR2$_{AVG}$, and the historical third frequency ratio FR3$_{AVG}$ according to the following formulas:

$$FR1_{AVG} = \frac{fr1_1 + fr1_2 + fr1_3 + \ldots + fr1_N}{N}$$

$$FR2_{AVG} = \frac{fr2_1 + fr2_2 + fr2_3 + \ldots + fr2_N}{N}$$

$$FR3_{AVG} = \frac{fr3_1 + fr3_2 + fr3_3 + \ldots + fr3_N}{N},$$

wherein
fr1$_1$, fr1$_2$, fr1$_3$, ..., and fr1$_N$ are respectively a 1$^{st}$ first frequency ratio, a 2$^{nd}$ first frequency ratio, a 3$^{rd}$ first frequency ratio, ..., and an N$^{th}$ first frequency ratio, fr2$_1$, fr2$_2$, fr2$_3$, ..., and fr2$_N$ are respectively a 1$^{st}$ second frequency ratio, a 2$^{nd}$ second frequency ratio, a 3$^{rd}$ second frequency ratio, ..., and an N$^{th}$ second frequency ratio, and fr3$_1$, fr3$_2$, fr3$_3$, ..., and fr3$_N$ are respectively a 1$^{st}$ third frequency ratio, a 2$^{nd}$ third frequency ratio, a 3$^{rd}$ third frequency ratio, ..., and an N$^{th}$ third frequency ratio.

10. The apparatus according to claim 9, wherein the apparatus further comprises a second processor connected to the first processor, wherein
the second processor is a backup processor of the first processor, and
the second processor is further connected to a second crystal oscillator and a second clock module, the second crystal oscillator is a backup crystal oscillator of the first crystal oscillator, and the second clock module is a backup module of the first clock module.

11. The apparatus according to claim 10, wherein the first crystal oscillator is a temperature compensated crystal oscillator.

12. A method for providing a time source for autonomous driving, in an autonomous driving system of a vehicle, wherein the method comprises:
providing a first time source for a first subsystem of the autonomous driving system by using a first crystal oscillator, and providing a second time source for a second subsystem of the autonomous driving system based on a received satellite time signal, wherein the first subsystem is configured to process driving service-related data of the vehicle, and the second subsystem is configured to process management-related data of the vehicle.

13. The method according to claim 12, wherein the method further comprises:
when the satellite time signal is not received, providing the second time source for the second subsystem by using the first crystal oscillator.

14. The method according to claim 13, wherein the providing a second time source for a second subsystem of the autonomous driving system based on a received satellite time signal comprises:
generating the second time source by using the satellite time signal as a reference frequency of the second time source, wherein the satellite time signal is received by using a signal receiving module; and
providing the second time source for the second subsystem.

15. The method according to claim 14, wherein the method further comprises:
synchronizing a third time source based on the second time source and a preset adjustment periodicity, wherein the third time source is a time source provided by a first clock module.

16. The method according to claim 15, wherein the method further comprises:
determining frequency ratios of the first time source, the second time source and the third time source, wherein the frequency ratios of the first time source, the second time source and the third time source comprise a first frequency ratio of the first time source to the second time source, a second frequency ratio of the first time source to the third time source, and a third frequency ratio of the second time source to the third time source;
determining a frequency ratio difference of any two of the first time source, the second time source and the third time source based on the frequency ratios of the three time sources and a historical frequency ratio corresponding to any two of the first time source, the second time source and the third time source, wherein the frequency ratio differences of the three time sources comprise a first frequency ratio difference between the first frequency ratio and a historical first frequency ratio, a second frequency ratio difference between the second frequency ratio and a historical second frequency ratio, and a third frequency ratio difference between the third frequency ratio and a historical third frequency ratio; and
determining, based on the first frequency ratio difference, the second frequency ratio difference, and the third frequency ratio difference, that a frequency of a crystal oscillator corresponding to a target time source in the first time source, the second time source, or the third time source offsets from a preset frequency range.

17. The method according to claim 16, wherein the determining frequency ratios of three time sources comprises:

determining the first frequency ratio FR1, the second frequency ratio FR2, and the third frequency ratio FR3 according to the following formulas:

$$FR1 = \frac{OS\_CLK_{Frequency}}{GNSS\_CLK_{Frequency}}$$

$$FR2 = \frac{OS\_CLK_{Frequency}}{RTC\_CLK_{Frequency}}$$

$$FR3 = \frac{GNSS\_CLK_{Frequency}}{RTC\_CLK_{Frequency}},$$

wherein $OS\_CLK_{Frequency}$ is a clock frequency of the first time source, $GNSS\_CLK_{Frequency}$ is a clock frequency of the second time source, and $RTC\_CLK_{Frequency}$ is a clock frequency of the third time source.

18. The method according to claim 17, wherein the determining a frequency ratio difference of any two of the three time sources based on the frequency ratios of the three time sources and a historical frequency ratio corresponding to any two of the three time sources comprises:

determining the first frequency ratio difference ΔFR1, the second frequency ratio difference ΔFR2, and the third frequency ratio difference ΔFR3 according to the following formulas:

$$\Delta FR1 = abs(FR1 - FR1_{AVG})$$
$$\Delta FR2 = abs(FR2 - FR2_{AVG})$$
$$\Delta FR3 = abs(FR3 - FR3_{AVG}),$$

wherein $abs(FR1-FR1_{AVG})$ is an absolute value of a difference between the first frequency ratio and the historical first frequency ratio, $abs(FR2-FR2_{AVG})$ is an absolute value of a difference between the second frequency ratio and the historical second frequency ratio, and $abs(FR3-FR3_{AVG})$ is an absolute value of a difference between the third frequency ratio and the historical third frequency ratio.

19. The method according to claim 18, wherein the method further comprises:

determining a $k^{th}$ first frequency ratio, a $k^{th}$ second frequency ratio, and a $k^{th}$ third frequency ratio based on a preset measurement periodicity, until N first frequency ratios, N second frequency ratios, and N third frequency ratios are determined, wherein 0<k≤N, and k is an integer; and determining, based on the N first frequency ratios, the N second frequency ratios, and the N third frequency ratios, historical frequency ratios corresponding to the three groups of frequency ratios, wherein the historical frequency ratios corresponding to the three groups of frequency ratios comprise the historical first frequency ratio corresponding to the first frequency ratio, the historical second frequency ratio corresponding to the second frequency ratio, and the historical third frequency ratio corresponding to the third frequency ratio.

20. The method according to claim 19, wherein the determining, based on the N first frequency ratios, the N second frequency ratios, and the N third frequency ratios, historical frequency ratios corresponding to the three groups of frequency ratios comprises:

determining the historical first frequency ratio $FR1_{AVG}$, the historical second frequency ratio $FR2_{AVG}$, and the historical third frequency ratio $FR3_{AVG}$ according to the following formulas:

$$FR1_{AVG} = \frac{fr1_1 + fr1_2 + fr1_3 + \ldots + fr1_N}{N}$$

$$FR2_{AVG} = \frac{fr2_1 + fr2_2 + fr2_3 + \ldots + fr2_N}{N}$$

$$R3_{AVG} = \frac{fr3_1 + fr3_2 + fr3_3 + \ldots + fr3_N}{N},$$

wherein $fr1_1, fr1_2, fr1_3, \ldots$, and $fr1_N$ are respectively a $1^{st}$ first frequency ratio, a $2^{nd}$ first frequency ratio, a $3^{rd}$ first frequency ratio, ..., and an $N^{th}$ first frequency ratio, $fr2_1, fr2_2, fr2_3, \ldots$, and $fr2_N$ are respectively a $1^{st}$ second frequency ratio, a $2^{nd}$ second frequency ratio, a $3^{rd}$ second frequency ratio, ..., and an $N^{th}$ second frequency ratio, and $fr3_1, fr3_2, fr3_3, \ldots$, and $fr3_N$ are respectively a $1^{st}$ third frequency ratio, a $2^{nd}$ third frequency ratio, a $3^{rd}$ third frequency ratio, ..., and an $N^{th}$ third frequency ratio.

21. The method according to claim 12, wherein the first crystal oscillator is a temperature compensated crystal oscillator.

* * * * *